(12) United States Patent
Birkner

(10) Patent No.: US 12,063,745 B2
(45) Date of Patent: Aug. 13, 2024

(54) METHOD FOR PROCESSING SUBSTRATES, IN PARTICULAR WAFERS, MASKS OR FLAT PANEL DISPLAYS, WITH A SEMI-CONDUCTOR INDUSTRY MACHINE

(71) Applicant: Integrated Dynamics Engineering GmbH, Raunheim (DE)

(72) Inventor: Andreas Birkner, Jena (DE)

(73) Assignee: Integrated Dynamics Engineering GmbH, Raunheim (DE)

( * ) Notice: Subject to any disclaimer, the term of this patent is extended or adjusted under 35 U.S.C. 154(b) by 132 days.

(21) Appl. No.: 17/306,570

(22) Filed: May 3, 2021

(65) Prior Publication Data

US 2021/0352835 A1 Nov. 11, 2021

(30) Foreign Application Priority Data

May 5, 2020 (DE) .............................. 102020112146
May 5, 2020 (DE) .............................. 102020112149

(51) Int. Cl.
*H05K 13/08* (2006.01)
*G06N 3/08* (2023.01)
*H05K 13/00* (2006.01)

(52) U.S. Cl.
CPC ........... *H05K 13/0818* (2018.08); *G06N 3/08* (2013.01); *H05K 13/0015* (2013.01); *H05K 13/0812* (2018.08)

(58) Field of Classification Search
CPC ........... H05K 13/0818; H05K 13/0812; H05K 13/081; G06N 3/08
See application file for complete search history.

(56) References Cited

U.S. PATENT DOCUMENTS

| | | | | |
|---|---|---|---|---|
| 6,217,212 | B1 * | 4/2001 | Brenninger | H01L 22/26 |
| | | | | 374/161 |
| 6,408,090 | B1 * | 6/2002 | Salomon | H05K 13/0815 |
| | | | | 382/153 |
| 6,506,614 | B1 * | 1/2003 | Strassmann | H05K 13/0413 |
| | | | | 438/7 |
| 9,914,213 | B2 * | 3/2018 | Vijayanarasimhan | ........................ |
| | | | | B25J 9/1697 |
| 10,424,520 | B1 * | 9/2019 | Sasaki | H01L 21/6719 |

(Continued)

FOREIGN PATENT DOCUMENTS

DE 102006015089 A1 * 10/2007 ....... H01L 21/67259
DE 202017106506 U1 4/2018

(Continued)

OTHER PUBLICATIONS

Office Action issued in counterpart German patent application No. 102020112146.6; 21 pp. w/ translation; Feb. 1, 2021.

(Continued)

*Primary Examiner* — Jeffrey T Carley
*Assistant Examiner* — Jose K Abraham
(74) *Attorney, Agent, or Firm* — Kaplan Breyer Schwarz, LLP

(57) ABSTRACT

A method for processing substrates, in particular wafers, masks or flat panel displays, with a semi-conductor industry machine, wherein a computer-supported process is used to determine the presence and/or position and/or orientation of the substrate. Further, a system designed to execute the method. The computer-supported process includes an artificial neural network.

13 Claims, 17 Drawing Sheets

(56) References Cited

U.S. PATENT DOCUMENTS

| | | | | |
|---|---|---|---|---|
| 10,639,792 | B2* | 5/2020 | Vijayanarasimhan | G05B 13/027 |
| 11,045,949 | B2* | 6/2021 | Vijayanarasimhan | G06N 3/008 |
| 11,440,184 | B2* | 9/2022 | Mariyama | G06N 3/088 |
| 2003/0139852 | A1* | 7/2003 | Kataoka | H01L 21/6875 700/258 |
| 2007/0282480 | A1 | 12/2007 | Pannese | |
| 2008/0091297 | A2 | 4/2008 | Tillmann | |
| 2008/0134075 | A1* | 6/2008 | Pannese | H01L 21/67742 715/772 |
| 2008/0232672 | A1* | 9/2008 | Birkner | G01N 21/9503 382/145 |
| 2010/0034621 | A1 | 2/2010 | Martin et al. | |
| 2012/0020545 | A1* | 1/2012 | Oike | H05K 13/0815 382/141 |
| 2012/0118083 | A1 | 5/2012 | Mori et al. | |
| 2012/0189188 | A1* | 7/2012 | Nagai | H05K 13/0815 382/145 |
| 2014/0207284 | A1 | 7/2014 | Kiley et al. | |
| 2017/0194187 | A1 | 7/2017 | Xu | |
| 2017/0252924 | A1* | 9/2017 | Vijayanarasimhan | G05B 13/027 |
| 2017/0270408 | A1* | 9/2017 | Shi | G06N 3/08 |
| 2018/0147723 | A1* | 5/2018 | Vijayanarasimhan | G06N 3/008 |
| 2018/0189580 | A1 | 7/2018 | Lee et al. | |
| 2019/0005357 | A1* | 1/2019 | Bhaviripudi | G06F 18/24133 |
| 2019/0152054 | A1 | 5/2019 | Ishikawa et al. | |
| 2019/0187555 | A1 | 6/2019 | Lin et al. | |
| 2019/0188840 | A1 | 6/2019 | Kwon et al. | |
| 2019/0252213 | A1 | 8/2019 | Koizumi | |
| 2019/0344446 | A1 | 11/2019 | Goto et al. | |
| 2019/0362221 | A1* | 11/2019 | Ando | G06N 3/047 |
| 2019/0382213 | A1 | 12/2019 | Hwang et al. | |
| 2020/0006102 | A1 | 1/2020 | Lin et al. | |
| 2020/0013657 | A1* | 1/2020 | Lee | H01J 37/32642 |
| 2020/0019853 | A1* | 1/2020 | Hsu | G05B 23/0218 |
| 2020/0026962 | A1* | 1/2020 | Sha | G03F 7/705 |
| 2020/0030970 | A1* | 1/2020 | Mariyama | B25J 9/1697 |
| 2020/0061811 | A1* | 2/2020 | Iqbal | G06N 3/08 |
| 2020/0073258 | A1 | 3/2020 | Chiu | |
| 2020/0090304 | A1* | 3/2020 | Leem | G06T 3/4046 |
| 2020/0168491 | A1* | 5/2020 | Miyada | H01L 21/67303 |
| 2020/0215686 | A1* | 7/2020 | Vijayanarasimhan | B25J 9/163 |
| 2020/0243359 | A1* | 7/2020 | Hao | H01L 37/32889 |
| 2020/0365436 | A1* | 11/2020 | Houng | G01N 29/225 |
| 2020/0381281 | A1* | 12/2020 | Yamamoto | H01L 21/67288 |
| 2021/0012576 | A1* | 1/2021 | Riegler | G06T 7/73 |
| 2021/0042910 | A1* | 2/2021 | Lee | G06T 7/521 |

FOREIGN PATENT DOCUMENTS

| | | |
|---|---|---|
| DE | 112017007025 T5 | 10/2019 |
| DE | 102018113336 A1 | 12/2019 |
| DE | 102019122790 A1 | 2/2020 |
| EP | 1366867 A2 | 12/2003 |
| EP | 3409230 A1 | 12/2018 |
| EP | 3648152 A1 | 5/2020 |
| JP | 0614080 A2 * | 9/1994 |
| KR | 101825832 B1 * | 2/2018 |
| KR | 10-2018-0122251 A | 11/2018 |
| KR | 10-2027951 B1 | 10/2019 |

OTHER PUBLICATIONS

Office Action issued in counterpart German patent application No. 102020112149.0; 23 pp. w/ translation; Jan. 28, 2021.

Extended European Search Report issued in EP patent application No. 21172261.6, Oct. 7, 2021, 6 pp. w/ translation.

Extended European Search Report issued in EP patent application No. 21172264.0, Jan. 21, 2022, 23 pp. w/ translation.

Partial European Search Report issued in EP patent application No. 21172264.0, Oct. 1, 2021, 24 pp. w/ translation.

Heng Ma et al., "A Scheme Integrating Neural Networks for Real-Time Robotic Collision Detection", IEEE International Conference on Robotics and Automation, May 21, 1995, pp. 881-886.

* cited by examiner

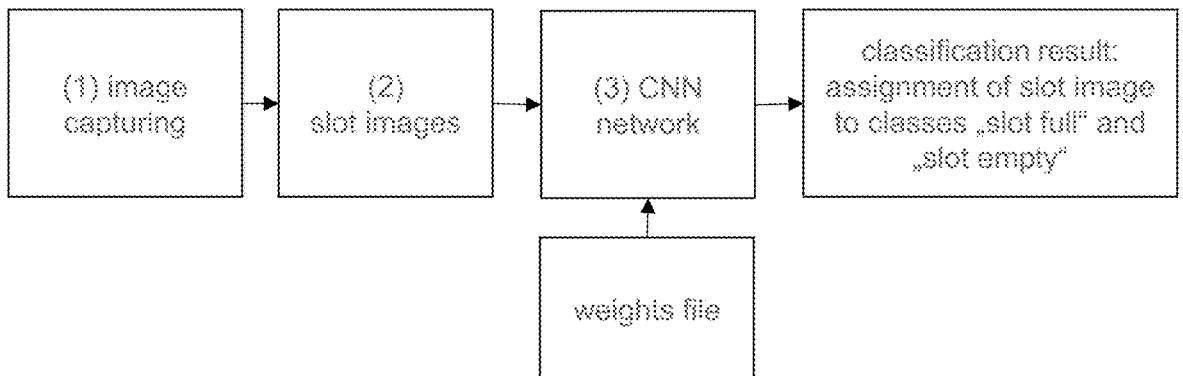
Fig. 5a
Fig. 5b
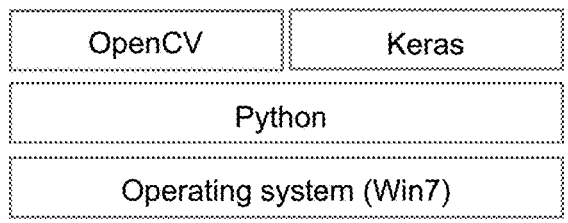
Fig. 7

METHOD FOR PROCESSING SUBSTRATES, IN PARTICULAR WAFERS, MASKS OR FLAT PANEL DISPLAYS, WITH A SEMI-CONDUCTOR INDUSTRY MACHINE

FIELD OF THE INVENTION

The invention is a method for processing substrates, in particular wafers, masks or flat panel displays, with a semi-conductor industry machine, wherein a computer-supported process is used to determine the presence and/or position and/or orientation of the substrate. The invention also regards a system designed to execute the method.

BACKGROUND OF THE INVENTION

Different semi-conductor industry machines can be used to process substrates, in particular wafers, masks or flat panel displays.

It is often necessary in the process to determine the presence and/or position and/or orientation of the substrate(s), which is (are) to be processed, at different locations in the machine. This information is needed in different ways, for example, to determine when picking substrates up from a cassette whether and/or where substrates are located in the cassette, and/or whether these substrates in the cassette are located where, for example, a robot is expected to pick up the substrate, or whether they are deposited incorrectly where, for example, two substrates are in one slot of the cassette instead of one substrate ("double slotted"), and/or whether a substrate is incorrectly positioned where it is positioned over several slots in the cassette instead of one slot. In addition, it must also often be checked, when a substrate is to be deposited in a cassette, whether the slot intended for it is free or whether it is already occupied. Similarly, this applies to other possible stations where one substrate or several substrates may be located in the machine, and, if applicable, to the particular type of station, for example trays, for processing stations, such as "chucks," positioning units such as xy tables, units for changing the orientation of a substrate, such as "prealigners" or "substrate flippers" or substrate rotators, substrate caches, substrate holders, robots or end effectors of robots. It may be necessary in the process to not only determine the presence and/or position and/or orientation of the substrates themselves, but also the presence and/or orientation and/or position of the processing station itself.

It may also happen that the substrates contain additional parts, for example a mask may contain a pellicle, wherein the mask with pellicle may occur in different orientations and/or positions in cassettes and/or on trays and/or on processing stations. It may be necessary to determine this position and/or orientation of the mask with a pellicle in order to, for example, check whether a robot with a gripper or end effector can pick up the mask with the specific position of the pellicle, and/or whether the mask with pellicle is in the correct orientation for processing at a processing station.

Moreover, substrates can also be equipped with further additional components. For example, wafers in a cassette may be mounted on special wafer holders if they, for example, would have too much deflection for transport or processing on account of being too thin. In addition, pellicles and wafers and flat panel displays can also be equipped with additional components, such as measuring equipment or calibration equipment, which may be necessary to calibrate the machine. Similar to the pellicle on the mask, it may also be necessary here to identify the position and/or orientation of these components.

For many machines in the semi-conductor industry, the processing takes place, at least in part, in vacuum chambers. The understanding is that the method according to the invention can also be used under vacuum conditions, provided the required components are designed to tolerate vacuums.

The detection of the presence and/or the position and/or the orientation of substrates is often used in the control or operation assigned to the machine for the control and the monitoring of processing of the procedures associated with the presence and/or the position and/or the orientation of substrates.

The detection of presence and/or position and/or orientation of substrates is often done using at least one sensor, wherein the at least one sensor can be designed in various technologies. For example, they can be optical sensors (light barriers, retroreflective sensors), capacitive sensors, inductive sensors or scanning sensors. It is necessary that the sensors are able to physically detect substrates (a mask, for example, may consist of transparent material, which places special demands on detection with an optical sensor), structural conditions of the machine must still be taken into consideration (such as distances between the sensor and substrate, which can place particular demands on the sensor and the setup and adjustment of the sensors and tolerances of the included components, especially for larger distances and a greater required accuracy), or scanning movements must be introduced (in order to, for example, scan a cassette with several substrates or a mask with a pellicle, wherein a scanning movement in the motion sequence can reduce a robot's productivity and therefore the machine's productivity). In addition, there must be a sufficient number of sensors to be able to detect all required positions and/or locations and/or orientations of substrates.

The disadvantages of detecting the location and/or orientation and/or position of substrates indicated above lead to various problems associated with semi-conductor industry machines.

Another aspect is training or teaching, also called "teaching in," the handling system. The handling system includes, for example, robots, wherein it is common that a robot, which has a so-called end effector for gripping and depositing a substrate, is used to move the substrates to be processed, especially wafers, masks or flat panel displays, from one processing station to another.

These types of robots usually move the end effector in several spatial directions and a system or machine for processing semiconductor elements needs to teach in the robots, i.e. to store the trajectory of a movement curve.

With the so-called "teach-in," a robot is taught a motion sequence and/or mechanically adjusted so that it can execute it during the system operation. In particular, a target position is learned during the teach-in, where the substrate is deposited by the robot. For many robots, the teach-in is performed manually with the motor axes switched off. The teach-in process usually occurs under visual monitoring by a user and the movement curve is performed by a large number of smaller individual steps, in particular the radial and theta motion. Two users are often needed here, as two or more directions or degrees of freedom need to be visually monitored during the teach-in process in order to avoid collisions.

Major damage may result if the user makes a mistake. In addition, the view of the user who is visually monitoring the robot's movement is often limited. This is especially true in vacuum chambers.

Furthermore, the teach-in process, or the preferably regularly performed check of the correct teach-in, is usually associated with the fact that the system has to be opened, which means it must be taken out of operation, resulting in the associated downtime. The so-called mini-environment of the system needs to be opened for this purpose, meaning the system can be contaminated, which in turn can cause additional machine downtime in order to then restore the required cleanliness in the system.

An inaccurate teach-in can lead to increased particle generation and thus to reduced yield of the process in which the system is used. An inaccurate teach-in can also lead to errors if the substrate is incorrectly deposited by too large of a margin of error.

Methods for teaching in or controlling a robot for moving a wafer or a mask or a flat panel display are known from the applicant's document EP 19 206 746.0, wherein cameras and rule-based image processing are used to detect objects, especially substrates such as masks (reticle), wafers or flat panel displays.

These methods can be used together with or in machines or systems in the semi-conductor industry, which are used to process wafers, masks or flat panel displays.

Here, cameras attached to the machines or systems, such as a camera mounted to an end effector or also cameras mounted at the deposit location or cameras mounted elsewhere, are used to determine whether the objects in question are in a certain location.

This is intended to be used, for example, to be able to determine the occupancy of a cassette with substrates. In addition, it should be possible to determine the orientation in which these objects are located with respect to the three translational and rotational degrees of freedom, whether they are in a predetermined position and in which configuration these objects are present.

The question arises here of whether a mask is formed with or without a so-called pellicle, and if yes, whether the pellicle is sitting above or below on the mask, and also in which orientation the pellicle is present. The camera generates images in the process, which can be manually/visually evaluated. Image processing can be used for this purpose.

This type of image processing is based on the method of identifying geometric objects or geometric properties of objects, or also shapes of objects by defining rules based on which these properties of objects can be detected.

For example, the position of an object edge can be determined by the fact that the edge of an object to be detected has a different color than the background, which is identified by the image recognition by defining a rule which defines the color values of the edge and the background, and defines the transition of the color values from the object to the background as one point of the edge. If, for example, several such rules are applied at different points of an object, the shape, position and presence of multidimensional objects can thus be determined.

Appropriate rules are defined here in discreet predefined sections of the image of an object here. Accordingly, image processing can also only work correctly if the object is in these predefined sections. Systems working according to this method are frequently called rule-based methods.

The disadvantage of such rule-based methods is that the rules need to take the fluctuations and influencing factors that occur in practice in operation into consideration.

This can be very complex if different influencing factors need to be taken into consideration. For example, it may happen that different lighting conditions, different colors of the objects and the background, different image sharpnesses, for example also as a result of vibrations occurring during image acquisition, light scattering from the environment or also tolerances of the position or location of the substrate, are to be taken into consideration when detecting an object, such as a mask, or determining the position or size of the object.

This is a purely exemplary list and is not considered exhaustive. Additional influencing factors may occur in complex production environments. To make things more difficult, it may happen that additional influencing factors may first appear during subsequent use of the method in the systems, such as in lighting conditions that vary during the year.

This can lead to very complex sets of rules in which the mostly manually created rules are listed.

However, these are increasingly complex to define and can also work increasingly unreliably, as the number of rules can be very high due to the combination of different fluctuations, causing a corresponding high number of error sources.

In addition, these rules are not flexible or are hardly flexible. For example, a fluctuation that is not provided for in a defined rule may easily lead to malfunctions in the image recognition, for example caused by changing light scattering from the system's environment.

Since the rules are usually defined in discreetly predefined sections of the image of an object, the image processing can then as a result only work correctly if the object is in these predefined sections.

Moreover, it may also happen that, regardless of influencing factors, a detection generally is not meaningful or possible via mostly manually created rules, because too many rules are needed from the start to detect an object.

For example, a method is known from EP 1 366 867 B1 for avoiding collisions between a robot and at least one other object, wherein a stop time is determined for a robot motion and wherein an obstruction check is performed using a neural network.

Furthermore, a method is known from EP 3 409 230 B1 for the movement of a robot arm, wherein an artificial neural network is made available that is used to find an optimal motion sequence for a robot as part of an ultrasound examination.

Finally, a method is known from DE 10 2018 113 336 A1 for use with a machine for performing a coordinate comparison for a robot between a machine coordinate system of the machine and a coordinate system of an image acquisition device.

But this method also does not allow for overcoming the disadvantages named.

Task of the Invention

The inventors have set themselves the task of providing a method for processing substrates, in particular wafers, masks or flat panel displays, with a semi-conductor industry machine, which allows for simpler and better teaching in and processing of these substrates.

It is considered desirable based on this to provide a method for processing substrates and a system that avoids the aforementioned disadvantages.

It should be possible to use the method in semi-conductor industry machines for processing substrates, in particular wafers, masks or flat panel displays, for example to control the movement of a robot or for control associated with detection based on images.

The method should, for example, make is possible to determine whether certain objects are located in a certain position. Furthermore, it should be possible to determine whether these objects are in a position in which they can be moved or processed.

It should preferably be avoided that many different rules and conditions have to be manually defined for the method sequence. Accordingly, it is desirable to turn away from a rigid, rule-based method to a method that offers a high level of flexibility with little effort at the same time.

SUMMARY OF THE INVENTION

The task of the invention is already solved by a method for processing substrates, in particular wafers, masks or flat panel displays, with a semi-conductor industry machine, as well as by a system designed to execute this method and a computer program product according to one of the independent claims.

Preferred embodiments and additional developments of the invention can be taken from the subject matter of the dependent claims, the description as well as the drawings.

Accordingly, the invention concerns a method for processing a substrate, in particular a wafer, a photolithographic mask or a flat panel display, with a semi-conductor industry machine, using an artificial neural network
- to determine the presence and/or position and/or orientation and/or type of the substrate based on at least one image, which shows a location in or on the semi-conductor industry machine or in the environment of the machine where a substrate can be located when operating the semi-conductor industry machine,
- wherein preferably the at least one image is taken by at least one acquisition unit,
- and wherein the artificial neural network
- generates and/or allows for an information data set comprising information about the determined presence and/or position and/or orientation and/or type of the substrate
- and/or generates and/or allows for a control command, which is used to directly control the semi-conductor industry machine, or that is used by the machine's control system,
- or is passed on to a higher-level control system,
- or is passed on to a user who draws conclusions from this information for his actions operating the machine,
- or who passes on this information to control systems or other users,
- or is saved for later or further evaluation.

The at least one image is acquired in digitized form by the artificial neural network and analyzed to generate the information data set and/or the control command that is used to directly or supportively control, align, train and/or monitor the semi-conductor industry machine.

The processing can concern the transport of a substrate between two or more stations, for example a deposit or a processing station, or for example the control of the machine processes.

The term 'semi-conductor industry machine' refers to general systems and equipment that are used in the semi-conductor industry. This means that the term 'semi-conductor industry machine' also refers to or includes a robot that can include a moving element, preferably a robot arm and/or an end effector. In addition, the term 'semi-conductor industry machine' also refers to a positioning unit that can be used to move or transport the substrate. Moreover, this may also be understood to include trays, processing stations or cassettes.

The semi-conductor industry machine can, as a result, include means for gripping, holding, transporting and/or depositing a substrate.

The semi-conductor industry machine may also be used in conjunction with or in a vacuum chamber, such as in connection with or in a vacuum chamber for wafers, masks or flat panel displays, or also with or on a vacuum robot, vacuum stage or vacuum chuck installed there.

In the sense of the invention, an artificial neural network is used to determine the presence and/or position and/or orientation of the substrate based on at least one image, which shows a location in or on the machine or in the environment of the machine where a substrate can be located when operating the semi-conductor industry machine and/or which is to be processed.

The term "image" is understood in the sense of the invention as a digitized image or a digitized representation of an analog image or an analog representation. The image can preferably depict or represent a location or area in or on the semi-conductor industry machine or in the environment of the semi-conductor industry machine where a substrate may be located in the event of a proper operation of the semi-conductor industry machine. This preferably deals with locations where a substrate is expected to be present.

In other words, the analog image may depict a location where a substrate should or could be located in case of a flawless operation of the machine. The analog image can therefore depict a substrate, but also a location or object without a substrate.

The location can typically be a pick-up or deposit location or a deposit for substrates, a storage for substrates, such as a cassette for the pick-up and storage of wafers. However, it may also be a location in the machine's environment, such as a floor area, which can be crossed while transporting the substrate. It may happen here, for example, that an improperly held substrate comes loose during transport and makes contact with the floor. The image may therefore show a substrate on or in a pick-up or deposit location, which is properly and flawlessly deposited. However, it may also show an improperly deposited substrate in an incorrect position, i.e. a substrate that is not flawlessly deposited, or also an empty pick-up location if for example the substrate was deposited in a different location.

In addition to the individual image, the image may also comprise one or several individual images, such as from videos or video sequences.

The at least one image may be taken by an acquisition unit and provided to the artificial neural network in digitized form, meaning that the image is virtually created "online" during operation of the handling system. However, it can also be provided to the artificial neural network virtually "offline" from a database.

The artificial neural network may record and analyze this image in digitized representation, i.e. use it for detection and classification, in order to generate an information data set and/or a control command. Of course, it is not only possible to analyze the image as a whole, but also to analyze only a section of the image.

The term "artificial neural network" in the sense of the invention includes one or more layers of neuronal layers, and/or one or more layers of "convolutional layers," also called "convolution layers," with their connections and/or weightings and/or other layers and/or the components assigned to the network, such as filters, activations, weightings, "poolings" or feedback, which are able to receive input data and generate output data from it in connection with the learned data. A "layer" refers to a hierarchical level here.

For this purpose, a model of an artificial neural network can be created, which can then be trained in a training phase. Through training, connections between artificial neurons and/or the layers can be weighted, or additional parameters can be determined, which control the generation of the information data set through the network. In this way, a trained artificial neural network can be provided. The artificial neural network can also have branching, also called "skip connections," which for example can be used for more complex tasks.

An artificial neural network suitable for the invention is designed to recognize objects in images, for example, from an image depicting an object, and then trained or taught to detect such an object. Moreover, such an artificial neural network can generate an information data set with at least one piece of information that such an object is depicted in the image.

In other embodiments, for example, positions of objects can at least be approximately detected.

Such artificial neural networks are known for different tasks in different configurations, for example, depending on the configuration, as a CNN network (CNN="convolutional" neural network), or ANN network (ANN="artificial neural network"), FCN network (FCN="fully convolutional" network), RNN network (RNN="recurrent" neural network), and others.

The configuration of such artificial neural networks can be adapted or the setup can be adapted to different tasks and they are typically trained or taught before application, but they can also adopt existing learning data or pre-taught learning data as a supplement or alternative. There are different implementation options for such networks, such as "TensorFlow" or "Keras."

The artificial neural network can form at least one model that comprises at least one convolutional layer and/or at least one neuronal layer. At least one of the following additional components may also preferably be included: an activation layer, a pooling layer, a flatten layer or a drop layer. What is advantageous is that the artificial neural network includes data for weighting at least one, but preferably several and particularly preferred all weightable components of the model. This weighting can be determined particularly easily through a training process.

In addition, the artificial neural network can use at least one of the methods of regression: "machine learning" or "deep learning."

The learning process of such artificial neural networks is often understood as a self-adaptive algorithm or as "machine learning." If a series of hierarchical levels or "layers" is used, this is also referred to as "deep learning," wherein the required number of layers for this is not precisely defined.

It is also understood in the context of the invention for the method for processing substrates, in particular wafers, masks or flat panel displays, with a semi-conductor industry machine, that preferably a trained or taught artificial neural network is used.

In the sense of the invention, at least one digitized representation of an analog image can be acquired and analyzed by the artificial neural network. The artificial neural network can use it to generate an information data set comprising information about the determined presence and/or position and/or orientation and/or type of the substrate. This information data set can be used to directly control the semi-conductor industry machine or it can be used by the machine's control system. The information data set can also be passed on to a higher-level control system.

The information data set can, for example, generate a control command or a control command can be generated by evaluating the information data set, which comprises an instruction to move a system unit of the semi-conductor industry machine, for example to move a robot and/or the movable element of the robot, preferably the robot arm or the end effector of the robot, or a positioning unit.

For example, the end effector can be moved to a slot of a cassette for wafers. The control command may also be an instruction to grip the substrate, to transport the substrate to a designated deposit location and/or to deposit the substrate at the designated deposit location.

The information data set may also be passed on to a user, such as wirelessly to a display unit or a display, so that the user can then use this information to draw conclusions for his actions to operate the machine. The user can also pass on this information to control systems or other users, or the information data set can be saved for later or further evaluation.

The information data set generated by the artificial neural network comprises at least information to make it possible to determine or derive the presence of the substrate in a slot, or on a tray, or on a robot, or on an end effector, or on a processing station in the machine, or at another location where the mask may be located in the semi-conductor industry machine.

The information data set may also comprise at least information that can be used to determine or derive the spatial orientation of the substrate with respect to the side of a slot facing a machine robot, or in relation to a tray, or in relation to a processing station, or in relation to another part of the machine.

In addition, the information data set may also comprise at least information that can be used to determine or derive the spatial location of the substrate with respect to a slot, or to a tray, or to a robot, or to an end effector, or to another location where the substrate may be located in the semi-conductor industry machine.

Furthermore, the information data set may also comprise information that can be used to determine or derive the type of substrate. The background for this is that substrates bearing different superstructures can also be processed in semi-conductor industry machines. Such superstructures may, for example, be parts of a measurement system introduced in the machine to calibrate the machine. The superstructures may, for example, contain a calibration device for the machine or measuring equipment or other components. These superstructures may have different shapes and, similar to a pellicle on a mask, may be in the machine with the substrate in different layers, orientations and positions. Consequently, processing the substrate also requires these superstructures and therefore the type of the substrate to be detected as well as their location, orientation or position on the substrate. As a result, the information data set may also comprise information about the type of the superstructure.

In addition, substrates can also be mounted on substrate holders, and may be located with the substrate holders, for example in a cassette or on a tray. The substrates can in turn be lying on the substrate holders, clamped to them or firmly bonded to the substrate holder with connection technologies, such as bonding. The substrate holders can also be located in the machine with or without substrate in different locations, orientations and layers, and must be detected. The substrates can be moved and/or processed in the process together with the substrate holder in the machine.

As a result, one embodiment of the invention may provide for the artificial neural network determining or classifying whether a substrate is a type without a superstructure and without a substrate holder,
with a superstructure and without a substrate holder,
without a superstructure and with a substrate holder,
with a superstructure and with a substrate holder.

In continuation of this list, additional dimensions can be included in the classification, such as the presence of a pellicle on a mask, and/or different embodiments of substrate holders or superstructures, meaning a large variety of possible substrate type configurations can result.

One embodiment of a substrate holder for masks that is especially used in EUV technology of the semi-conductor industry, i.e. in the field of photolithography, consists of a lower and upper shell ("dual pod"), in which the mask is enclosed on all sides, wherein the container can in turn be located in a cassette or on a tray.

According to the invention, the method of artificial neural network depicted also makes it possible to determine the presence and/or location and/or orientation and/or position of a substrate type, such as the presence of a certain type of substrate.

Furthermore, it is also possible to classify the type of substrate.

For this purpose, the artificial neural network is configured accordingly so that it can detect the required types, i.e. additional output neurons must be added for the added classes. For example, a model that detects the two classes of "open slot" and "occupied slot" for wafers can, for example, add the detection of a wafer with a substrate holder by adding an output neuron. The then total of three output neurons represent three classes of "open slot," "slot with wafer without substrate holder" and "slot with wafer with substrate holder."

Changes can then be made to the layers as a supplement in order to align the artificial neural network for more complex tasks. The example makes it evident that the artificial neural network can generate an information data set that can be used to derive both the presence and the type of a wafer (with or without substrate holder).

The learning processes, as explained further below, can occur, for example, with the additional images and classes of the wafer with or without a substrate holder, and in the application the artificial neural network then generates data sets that can be used to derive the three described classes. This means it can be derived whether the slot is open or occupied (presence of a wafer) and, if the slot is occupied, whether the wafer is a wafer with or without a substrate holder.

Similarly, the information data set can also comprise at least information that can be used to determine or derive the presence of a pellicle on a substrate, in particular on a mask, and/or the side, i.e. the top or bottom of a deposited substrate, in particular a mask, on which a pellicle is located.

Moreover, the information data set may also comprise at least information that can be used to determine or derive the orientation of a pellicle in relation to a reference axis of a tray, a cassette, a robot or an end effector.

In summary, the information data set may comprise at least information that can be used to determine or derive the presence and/or position and/or orientation and/or the type of a substrate.

An important aspect of the invention is to obtain information for substrate processing as to whether the substrate can be processed or transported, or not, for example due to an incorrect position. The information regarding possible incorrect positions, for example, can provide a statement about whether the incorrect position concerns a substrate lying across several levels of a tray ("cross-slotted"), for example whether the substrate is on the provided support points of this tray, and/or whether the incorrect position concerns at least two directly overlaid substrates ("double-slotted") on one support point, i.e. whether there is more than one substrate on the support points or the tray, in particular if only one substrate is provided at this support point.

Moreover, the information can provide a statement about whether the incorrect position is a deviation from an intended target position of the substrate, and/or whether the incorrect position concerns a substrate that is not correctly lying on all provided support points of a tray.

The information data set generated by the artificial neural network thereby provides information that can influence and determine the further processing of the substrate. The substrate can also be located in cassettes and/or on trays and/or on an end effector and/or on a chuck and/or on a processing station of the machine and/or on a positioning unit.

In another aspect, the invention concerns a method for processing substrates, in particular wafers, masks or flat panel displays, with a semi-conductor industry machine, wherein for the determination of the presence and/or position and/or orientation and/or type of a substrate an artificial neural network is preferably used to determine the presence and/or position and/or orientation of the substrate based on at least one image depicting a location in or on the semi-conductor industry machine or in the environment of the semi-conductor industry machine where a substrate may be located during operation of the semi-conductor industry machine, wherein the at least one image is taken preferably from at least one acquisition unit, and wherein the generated information data set is used to generate or derive a control command for controlling the semi-conductor industry machine. The derived control command can be used to directly control the semi-conductor industry machine, or the derived control command can be used by the machine's control system or passed on to a higher-level control system, or the derived control command can be generated by the higher-level machine.

The image can be acquired by an appropriate acquisition unit and converted into a digital representation, or also fed from a database.

At least one acquisition unit can be provided to create the image, which can be integrated in the machine and/or mounted to the machine. It can also be located in the machine's surrounding environment. The acquisition unit can be permanently integrated or mounted, or also just temporarily, such as for training the artificial neural network, and can then be removed again after the teaching is completed.

In one embodiment of the invention, at least one acquisition unit is installed in a fixed location with respect to the machine. This makes it possible to always obtain the same perspective or viewing direction while taking the images, regardless of the machine's operating state, so that even the slightest changes or deviations from a target position of the substrate can be reliably detected.

It is also possible that at least one acquisition unit is located on moving elements of the machine, for example on a robot arm or a moving element, such as on an end effector of a robot, or on a positioning unit. This makes it possible to take images of the substrate or of the intended location during operation from different viewing directions, which can be advantageous if parts of the image are obscured in views from certain viewing directions, making the image taken incomplete.

That is why a particularly preferred embodiment of the invention provides for the artificial neural network creating and recording at least one additional image of the location in the case of unclear statements or unclear assignments, wherein advantageously this second, additional image differs from the first in at least one aspect, such as the viewing direction.

In the case of a partial obscurement, another image of the same location can be taken from a different viewing angle in this way, for example, which is not blocked by the obscurement. This second image capture from another viewing angle can be initiated by the artificial neural network itself in a preferred embodiment of the invention by issuing a corresponding control command to the machine's control system.

Moreover, if at least one acquisition unit is mounted to a robot or a positioning unit and can be positioned, this acquisition unit can be positioned and aimed at different locations, which can reduce the number of necessary acquisition units in a machine.

The acquisition unit may comprise an optical sensor, an ultrasonic sensor, a distance sensor, a reflex sensor, a radar sensor, an imaging camera or video camera, or an infrared camera.

The infrared camera makes it possible, for example, to provide additional information about the objects' thermal radiation in the field of view, i.e. of the location or of the substrate. This can be useful if, for example, the substrate is to be exposed to a precisely specified temperature for certain processing processes and the substrate is only to be moved if the substrate itself or the vicinity is at a certain temperature.

The radar sensor makes it possible to generate distance values of objects or of individual points of objects to the sensor in the two-dimensional area detected by the sensor, which, combined with the third spacing dimension, can constitute a three-dimensional profile of the detected area, which is used for training or teaching in place of the optical image, or is also used for applying the artificial neural network.

A preferred embodiment of the invention also provides for the artificial neural network to acquire more than one image, in particular at least two images of the same location, which were generated by different acquisition units and/or acquisition units that are arranged differently. The information in these images can be analyzed in a particularly advantageous way by the artificial neural network and combined to considerably improve the allocation to the stored classes and therefore to improve the quality of the information data set. In particular, this can improve the artificial neural network's basis for making decisions.

Much more accurate information about a substrate can be obtained here, and the machine can be controlled much better.

In a first aspect, at least two images can be taken by the artificial neural network, which differ in the position of the acquisition unit and therefore in the viewing direction of the image taken. It is also possible here to show, for example, areas that are obscured in one image.

It may be advantageous here, for example, to install one first acquisition unit, for example a camera, to be stationary on the machine that takes an image of the substrate or location, and another, second acquisition unit, for example a camera or a video camera, which is located on a moving element of the machine, such as on the end effector or the positioning unit. During operation, a first image can then be generated with the first camera and supplied to the artificial neural network. If the evaluation by the artificial neural network then cannot provide reliable information, for example, as to whether the substrate is located on all support points of a tray completely and correctly, then the second camera or video camera can then be switched on during another approach of the end effector to the substrate or the location and generate additional images or video sequences that are fed to the artificial neural network. If several images of the location to be examined are then available, this gives the artificial neural network a better database and can help to significantly increase the reliability of analysis.

This method can be used to minimize the effects of incorrect positions particularly favorably, since it can be determined with much greater accuracy whether a substrate can still be processed or not, for example. This increases the efficiency of the semi-conductor industry machine.

In addition to an acquisition unit to create the at least one additional image, which is arranged differently in comparison to the generation of the first image, the second image can also be generated with an acquisition unit that contributes other information. For example, a camera working in a visible wavelength range can be combined with an infrared camera or an infrared camera can be combined with a radar sensor.

Another preferred embodiment provides as a supplement or alternative for improving the reliability of determination by the artificial neural network and therefore the quality of the information data set if, for example, the artificial neural network cannot obtain an unambiguous statement about the presence of a substrate.

For example, a slightly skewed substrate that is therefore not located completely correctly can still be processed under certain conditions, for example by specifying certain control commands to the machine's control unit to be able to still grip the substrate that is slightly skewed.

According to the invention, an embodiment provides in a second step for analyzing at least one characteristic determined by the artificial neural network by using another method of image recognition after being analyzed by the artificial neural network. For this purpose, a classic method of image recognition can be used, in particular a rule-based method. This may, for example, be a method for detecting edges via (classic) image processing. The originally acquired image can be used for this purpose. Moreover, sensors which are not based on image acquisition can also be used as a supplement.

The two-stage approach outlined here can be used to check the reliability of information from the artificial neural network and/or to improve it by combining the first step with the second step.

It is evident to the expert that the aforementioned methods can also be combined with each other. This leads to a major advantage of the invention, seen in the fact that not only can completely flawlessly deposited substrates be processed, but also substrates that are seen as still being capable of processing by the artificial neural network based on correspondingly classified images.

A lighting device is also intended, which is designed to emit electromagnetic radiation in the direction of the substrate or the corresponding location in the field of view of the acquisition unit in or on the machine or the environment. In one advantageous embodiment of the invention, the lighting device is coupled with the acquisition unit so that the lighting device is then preferably switched on and electromagnetic radiation emitted when capturing an image with the acquisition unit.

When using a camera that is sensitive in the visible wavelength range of the electromagnetic radiation, it is convenient if the lighting device also emits electromagnetic radiation at least in the visible wavelength range, i.e. in the wavelength range between 380 and 780 nm. It is therefore advantageous that the lighting device is designed so that it emits electromagnetic radiation at least in the wavelength range in which the acquisition unit is sensitive.

In this context, images which were captured under different lighting can also be acquired and fed to the artificial neural network.

The lighting device can be permanently or temporarily integrated in the machine and/or mounted to the machine. It may be advisable for the lighting device be installed in a fixed location with respect to the machine in order to create the same lighting situations for capturing an image.

However, it can also be advantageous to arrange the lighting device on moving elements of the machine, preferably on a robot arm or on an end effector of a robot or on a positioning unit. This arrangement can be particularly advantageous if the acquisition unit is arranged together with the lighting device so that, during image acquisition, lighting comes from the same direction from which the image is being captured.

The acquisition unit and lighting device can, for example, be provided together in one housing in a compact design.

The artificial neural network can be included or integrated in a processing unit as a component of a computer architecture, wherein the computer architecture can also comprise computer hardware and an operating system of the computer as additional key components in addition to other components or elements.

It is advantageous that the computer architecture is designed so that the artificial neural network creates the information data set nearly in real-time or even in real time as per DIN ISO/IEC 2382. This is to be understood as the time span between the artificial neural network capturing the image and outputting the information data set. It is also conceivable to capture images and generate the information data set with a delay if this is possible in the specific application.

The computer architecture can be centrally or decentrally organized. This means that at least the three aforementioned components of the processing unit, computer hardware and operating system can be combined in one place, or individually distributed at different locations, or also arranged in different locations. The communication between the individual components can be wired or also wireless via suitable wireless methods, such as W-LAN or Bluetooth. The acquisition unit can also transmit the images wired or wirelessly In a centrally organized embodiment of the invention, these components can thus be integrated in a system controller of the semi-conductor industry machine, for example in a robot or in an end effector of a robot, or in a robot controller. The computer architecture can also be integrated in a control system at a higher level than the machine.

In a preferred embodiment, this computer architecture can be integrated in a control system that is not assigned to the machine, such as in a cloud or in another computer at any location worldwide. This makes it possible, for example, to bundle and make available all data required for the artificial neural network in one central location.

According to a decentrally organized embodiment of the computer architecture, individual components of the aforementioned components, i.e. processing unit, computer architecture hardware or operating system, can be arranged at different locations. These can be the aforementioned positions, such as the system controller of the machine or the end effector.

It may therefore be favorable to run the processing unit and/or the operating system distributed over more than one of these positions as described above. This is convenient if, for example, there are very large data inventories with images or such inventories were generated, which are to be centrally stored and managed. The processing unit with the data inventories can then be kept in a central cloud, for example, and the computer hardware and/or the operating system can be kept decentrally on or in the semi-conductor industry machine. It is evident to the expert that other combinations are also possible and may be favorable.

For example, the artificial neural network can also be trained on a different computer architecture than the application of the artificial neural network.

In another aspect, the invention concerns a method for providing a taught or trained artificial neural network for use in a method for processing substrates, in particular wafers, masks or flat panel displays, with a semi-conductor industry machine, wherein an artificial neural network is used to determine the presence and/or position and/or orientation of a substrate.

The method for providing a taught or trained artificial neural network may include the following steps:
Provision of a processing unit, which has or comprises at least one artificial neural network,
Training the artificial neural network by capturing and providing at least one image, preferably a plurality of at least 20 images, at least 100, particularly preferably at least 1,000 images.

It may be possible to train the artificial neural network with just one or a few images. For example, an image may show a substrate that is flawlessly deposited on a slot, which then is used by the artificial neural network for further analysis. It can be disadvantageous here that only such images of substrates can then be recognized as flawless and evaluated as such if they correspond to this one image. Even slight deviations from this position could then no longer be optimally detected by the artificial neural network.

That is why in most cases it is better to provide several images, preferably a large number of images, preferably at least 20 images, at least 100, particularly preferably at least 1,000 images or even more to the artificial neural network.

As stated above, the digitized image may comprise the entire captured analog image, or also just a section of an image or even several sections of the image. This may be convenient if, for example, the proper occupancy of a cassette is to be checked for wafers. Such a cassette can, for example, comprise 25 individual deposit locations for wafers, wherein individual images or slot images are then generated from an analog overall image for each deposit location, in the example 25 individual images.

An image section or an individual image can accordingly show a deposit location. The processing unit may advantageously comprise corresponding modules or equipment for image processing here.

In a preferred embodiment, the method for providing a taught or trained artificial neural network comprises capturing and/or providing a plurality of images for training, which differ in the expression of at least one parameter or influencing factor. These parameters may relate to the substrate or the vicinity of the location to be captured.

Accordingly, images preferably differ from each other in the expression of at least one parameter. This may include:
- the presence of the substrate in a location, i.e. the presence or absence of a substrate in a location, for example in the slot of a cassette or on a tray, and on which a substrate should be present. Of course, these images may also include locations where no substrate should be present during faultless machine operation,
- the location of the substrate in relation to a target location, for example the correct position of the substrate on the support points provided for this purpose,
- the orientation of the substrate in relation to a reference in the machine
- the number of substrates in a location, for example the number of substrates in a slot of a cassette or in the cassette overall,
- the color and/or the transmission behavior of the substrate,
- the type of substrate
- the dimensions of the substrate
- the condition of the edges of the substrate
- the presence of identification tags, for example the presence of so-called "wafer notches" on or in the substrate,
- the condition of the surface of the substrate, for example a smooth, rough or coated surface,
- the presence of a pellicle as well as the location, position and orientation of the pellicle in relation to the substrate.
- Additional parameters may relate to the environment:
- the lighting conditions, such as the luminosity and/or light direction,
- the type, color and/or condition of the background,
- the image sharpness,
- the focus,
- the reflection of other objects on the substrate
- light scattering from the environment.

The aforementioned list of parameters and influencing variables as well as their possible expressions is not to be considered as conclusive. Rather it represents a selection of suitable parameters and expressions of these parameters.

In a further development of the invention, differences can also be artificially created in at least some of these images, for example through so-called "augmentation." The images used for this purpose may come from the acquisition unit, or other images can also be used, such as from a database.

The artificial neural network can be trained using a categorization or classification of images.

The goal for training the artificial neural network is typically to capture and classify the largest possible bandwidth of different expressions of the parameters.

A preferred embodiment provides that images are captured and stored in the machine also during the application of the artificial neural network, i.e. during the method for processing substrates with the semi-conductor industry machine, in order to use these in at least one initial or at least one new learning process for additional training and therefore to constantly improve the result of the artificial neural network.

This makes it possible, for example, to detect fluctuations in the expression of parameters, which may result over longer time periods, and provide them to the artificial neural network. For example, it may happen that the lighting conditions may change at an acquisition location for substrates throughout the course of the year due to the natural light changing. Continuous tracking can compensate for these types of fluctuations or "subtle" changes.

Even in the case of artificial lighting, these types of "subtle" changes can occur during operation of the semiconductor industry machine, which can lead to problems in rule-based image processing systems. So, for example, even modern LED lights and illuminants are subject to signs of aging, for example degradation, loss of brightness and/or loss of luminous flux. The luminous flux can change over time, in particular it can decrease over time. This can happen at different rates. The decline is not linear. The luminous flux initially only declines very slowly and then increases its rate of decline over time. The reasons for this may lie in minimal impurities in the semiconductor crystal of the LED chip, which can lead to material changes over time.

The advantages of the method as per the invention come to bear here as well. For example, the artificial neural network can be "re-taught" in a virtually continuous state in which current images are captured by the artificial neural network at certain regular time intervals, such as once weekly or monthly. These images can be compared with existing stored images so that the artificial neural network can be trained continuously or virtually continuously in relation to the changes related to the production environment and/or the substrates. The artificial neural network can thus be used to compensate for very minor changes in the production environment, but also with respect to the substrates, for example if geometric dimensions change. This is not possible with rule-based systems. An augmentation seems difficult here as well, since aging processes of lights, for example, would have to be simulated.

The invention furthermore comprises a system for processing substrates, in particular wafers, masks or flat panel displays, designed to execute a method as described above.

Another aspect of the invention concerns a method for monitoring or controlling a handling system, wherein at least one image depicting a location in or on the handling system or in the environment of the handling system is captured in a digitized form by an artificial neural network, and wherein the artificial neural network analyzes the image and creates an information data set and/or generates a control command that directly or supportively controls, aligns, trains and/or monitors the handling system.

A handling system may refer to a robot that can include a moving element, preferably a robot arm and/or an end effector. Furthermore, the term 'handling system' can in particular refer to a positioning unit, which is used to grip, transport and/or deposit a substrate or may have means suitable for doing this.

The artificial neural network may record and analyze an image in digitized representation, i.e. use it for detection and classification, in order to generate an information data set and/or a control command that is used to directly or supportively control, align, train and/or monitor the handling system. Of course, it is not only possible to analyze the image as a whole, but also to analyze only a section of the image.

This means that the handling system and/or at least one component of the handling system, such as a robot or end effector, can be aligned and/or adjusted and/or trained.

This can be done manually if a user provides the information, and or at least partially automatically in that the machine itself uses the information from the information data set, and independently configures the handling system and/or the components of the handling system with the values to be set, such as the position data of a robot, so that the handling system can align, adjust or train itself at least partially automatically. Combinations are also possible.

The handling system can also be monitored continuously in operation or at certain intervals to determine whether the set alignment, adjustment or teaching is still within defined limits, and the result of the monitoring is shown to a user who can then initiate measures if set values are unreliably deviated from, and/or the machine control system evaluates the information, which can then autonomously initiate measures, and/or the machine control system evaluates the information and autonomously performs new alignment, adjustment or training, and/or the information is passed on to a higher-level control system, and/or the information is used for process control, and/or the information is saved for further use, and/or the data is used to plan the next maintenance service.

Furthermore, the artificial neural network can also be used to detect machine parts that may form an obstacle in the movement area of the handling system's components. This includes, for example, unopened doors when transferring a wafer, a mask or a flat panel display to a vacuum chamber. This also includes, for example, an unopened wafer cassette from which a wafer is to be removed.

An artificial neural network suitable for the invention is designed to recognize a certain object, such as a substrate, in images for example, from an image depicting this object, among other things, and then was trained to detect such an object. In other embodiments, for example, orientations, positions or dimensions of objects can be at least approximately detected.

In the sense of the invention, an artificial neural network trained this way can generate an information data set with at least one piece of information that can be used to monitor and/or control the handling system, or it can be used to generate a control command that helps control the handling system. The handling system can thus be directly or supportively monitored, aligned, trained and/or controlled.

In the sense of the invention, the artificial neural network is designed to determine the presence and/or the position and/or the orientation of an object in the image, especially a substrate, a wafer, a mask, a flat panel display, or a part of the substrate, a tray, a cassette, a processing station or a machine or part of an object, or a marker, and/or for a classification to determine the type of object, and/or to determine the distance between at least two objects, and/or to determine the position of the object in relation to a reference point of the handling system, and/or to determine the dimensions of the object.

The position of an object may be the position of the object or a part of the object in relation to a fixed or moving reference point in the machine, and/or the position of the object in relation to an acquisition unit, which is permanently installed in or on the handling system, or is on a moving part, such as on a robot, or on an arm of the robot or on an end effector, and/or the position in relation to a different object.

Additionally, geometric methods, such as triangulation, can be used to determine the position and/or orientation and/or distances of objects and/or the acquisition unit and/or reference points in the space, wherein this information can then be combined with information from the artificial neural network.

It is also possible to use the artificial neural network to detect whether objects or obstacles are present in the movement area or the trajectory of the handling system and/or of an object moved by the handling system, such as a mask, a wafer or a flat panel display, and/or to initiate measures to avoid a collision of the handling system with these obstacles and therefore to prevent any possible damage.

For this purpose, images can be taken of the intended trajectory before the handling system begins along said trajectory, and then these images are transferred to the artificial neural network. Images can be taken from different positions here to also analyze any concealed areas, which is advantageous. The artificial neural network can then use these images to compare images of these trajectories in an error-free state to determine whether unplanned objects are in the trajectory. In these cases, a control command can be generated and given to the handling system, which causes the handling system to stop immediately. The handling system as per the invention thus also makes it possible to detect obstacles in the trajectory of the handling system.

For example, the movement area of the handling system can be continuously or temporarily monitored with at least one acquisition unit and the handling system can be stopped if an obstacle is detected.

A preferred embodiment provides that images are captured and stored in the machine also during the application of the artificial neural network, i.e. during the method for processing substrates with the semi-conductor industry machine, in order to use these in at least one initial or at least one new learning process for additional training and therefore to constantly improve the result of the artificial neural network.

The invention accordingly also comprises a handling system, a system or a machine for processing substrates in the semi-conductor industry, designed to execute a method as described above.

The system may comprise a semi-conductor industry machine, a robot, a moving element, preferably a robot arm and/or an end effector, or a positioning unit, a processing unit, which comprises at least one trained artificial neural network, and an acquisition unit for capturing at least one image.

The invention also comprises a computer program product that can be loaded directly in a memory of a processing unit of the system as described above, with program code means to execute a method for processing substrates, in particular wafers, masks or flat panel displays, with a semi-conductor industry machine when the computer program product is executed in the processing unit.

The invention's method for processing substrates, in particular wafers, masks or flat panel displays with a semi-conductor industry machine results in a multitude of advantages. These machines can thus work sufficiently reliably, even at a high level of complexity, and the machine can respond to fluctuations flexibly.

Another major advantage is that the algorithms for processing criteria at least do not have to be completely preconceived by a system operator or programmer or rigid rules do not have to be created, but rather the artificial neural network works out these algorithms independently in a learning process, i.e. the training.

Since this learning process can be done independently, even with a very high possible number of iterations, wherein the network is independently optimized further with each iteration at a certain learning rate, much more complex parameters or influencing factors can be provided than is economically feasible using manually created rules.

In addition, a correspondingly large number and suitable selection of images, showing real objects and their environments, and which are used for training, can be used to take many different parameters into consideration.

Moreover, these images that are used for learning can, for example, be modified further via image processing by varying, for example, the image noise, and/or the contrast, brightness, image sharpness, scaling, aspect rate, rotation, image background and/or other image parameters, and thus the different parameters or at least some of them can be included in the learning process during training or teaching.

Such methods are known, for example, as "augmentation."

In this way, the invention results in a trained artificial neural network, which detects substrates in different expressions (through classification, detection or prediction) more reliably than rule-based image processing. In addition, this can be achieved with less effort than with rule-based image processing.

Moreover, the artificial neural network is less restricted to evaluating discreet regions, like rule-based image processing is, when evaluating an image.

This means that complete analog images in which an object can be detected can also be included in the evaluation by the artificial neural network, even if the object is in a different position in relation to the learned images. This is a big advantage compared to rule-based image processing, where typically one discreet region is defined to detect an object. If the object is located outside of this region on account of a position deviation, it cannot be detected.

It is also possible to not only detect the recognition of the object, i.e. the presence of the object (classification), or to detect its orientation, but also to detect its position, especially its approximate position (detection). For detection then, a so-called "bounding box," for example, can be first taught by the artificial neural network for the detected object, and then the at least approximate position of the object can be marked in the application with the "bounding box."

The invention makes it possible to detect a substrate, such as a mask, a wafer or a flat panel display, as well as to determine the position or size of the subject in different lighting conditions, in case of different colors of the substrate or the background, or also in the event of different image sharpness, for example as a result of vibrations occurring during the image acquisition, in the case of light scattering from the environment or in case of smaller deviations of the position or location of the substrate, which are in a tolerance range.

BRIEF DESCRIPTION OF THE DRAWINGS

The invention is described in more detail below using preferred embodiments and referring to the accompanying figures.

DETAILED DESCRIPTION OF PREFERRED EMBODIMENTS

In the following detailed description of preferred embodiments, the same reference signs designate essentially the same parts in or on these embodiments for the sake of clarity. To better illustrate the invention, however, the preferred embodiments shown in the figures are not always drawn to scale.

The invention generally concerns a semi-conductor industry machine for processing a substrate, in particular a wafer, a photolithographic mask or a flat panel display. The processing can concern the transport of a substrate between two or more stations, for example a deposit location or a processing station, or also the processing of a substrate.

The invention also concerns a handling system, wherein the handling system comprises a robot or a moving element, preferably a robot arm and/or an end effector, and/or a positioning unit, and wherein the handling system preferably has means for gripping, transporting and/or depositing a substrate. The handling system can concern the transport of a substrate between two or more stations, for example a deposit location or a processing station, or also the processing of a substrate.

According to the invention, at least one image depicting a location in or on the handling system or in the environment of the handling system is captured in a digitized form by an artificial neural network, and the artificial neural network analyzes the image and generates an information data set and/or a control command, which directly or supportively controls, aligns, trains and/or monitors the handling system.

The image can also be fed to the artificial neural network from a database.

Figure 1:
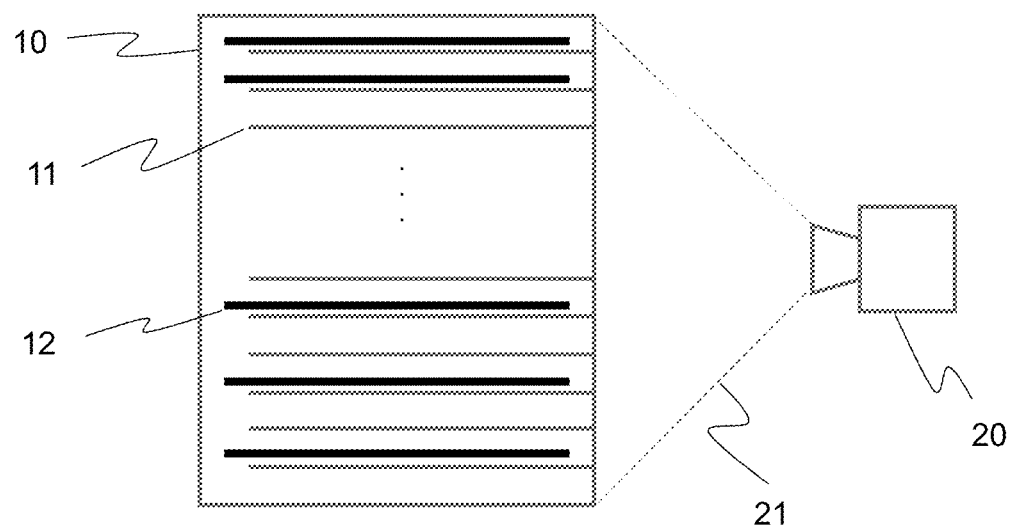
FIG. 1 a schematic example of a design with an opened cassette to accommodate wafers with correctly arranged wafers and an acquisition unit, FIG. 2 a schematic image of an opened cassette from FIG. 1, FIG. 3 a schematic depiction of the process of training and teaching the artificial neural network using a design example of a cassette populated with wafers, FIG. 4 a schematic setup of a "CNN" network of the cassette occupancy in a very simplified representation, FIG. 5a a schematic application of the trained artificial neural network for detection of a cassette occupancy, FIG. 5b a schematic section of a classification table based on a design example, FIG. 6 a schematic design example of another setup with an acquisition unit and a lighting unit, FIG. 7 a schematic design example for a suitable software architecture, FIG. 8 a schematic design example for a computer architecture, FIG. 9 a schematic design example of an opened cassette with wafers in the correct position and in an incorrect position, FIG. 10 a schematic design example of a receptacle for wafers with a wafer placed in the correct position, FIGS. 11a, 11b a schematic design example of a receptacle for wafers with a wafer placed in the correct position (FIG. 11a) and in an incorrect position (FIG. 11b), FIGS. 12a, 12b another schematic design example of a receptacle for wafers with a wafer placed in the correct position (FIG. 12a) and in an incorrect position (FIG. 12b), FIGS. 13a-13f another schematic design example of a receptacle for wafers with different pellicle designs, FIGS. 14a-14f a schematic design example of an image recognition based on wafers with different pellicle designs, FIGS. 15a, 15b another schematic design example with different arrangement of the acquisition unit, FIG. 16 a schematic view of a system for processing semiconductor elements, FIG. 17 a design example with a single camera housing with two cameras, FIG. 18 a design example in which a camera with integrated lighting is integrated in an end effector, FIG. 19 another design example of the invention in which the cameras are arranged on the arms of the end effector, FIG. 20 a side view and a top view from above of the key components of a semi-conductor industry machine for processing semiconductor elements, FIG. 21 the system shown in FIG. 20 at rest in a top view, FIG. 22 the system shown in FIG. 20 in an operating state in a top view, FIG. 23 the system shown in FIG. 20 in another operating state in a top view, FIGS. 24a, 24b each a design example of a substrate with a superstructure using the example of a mask, FIGS. 25a, 25b each a design example of a substrate with a substrate holder using the example of a wafer, and FIG. 26 a design example with an upper and lower shell.

FIG. 1 shows a schematic design example with a storage 10 in the form of an opened cassette for receiving substrates 12, in the design example for the reception of wafers, in a top view.

The example only shows one section of the storage 10, which has a total of 25 individual deposit locations 11 or slots for receiving an individual substrate 12 each.

The design example only shows 9 such deposit locations 11. Of the deposit locations 11, five deposit locations 11 are occupied with substrates 12 in the example and four deposit locations 11 are not occupied. In the design example, all deposit locations 11 that are occupied are correctly occupied. In other words, all wafers 12 are correctly and flawlessly deposited.

The computer architecture and the semi-conductor industry machine are not shown in the design example.

The semi-conductor industry machine may comprise a robot that can comprise a moving element, preferably a robot arm and/or an end effector. In addition, the semi-conductor industry machine can also comprise a positioning unit that can be used to move or transport the substrate. The substrate can not only comprise wafers as in the design example, but also, for example, masks or flat panel displays.

As a result, the semi-conductor industry machine can comprise a device for picking up and/or moving and/or depositing a substrate. The design example depicted accordingly shows a section of a system as per the invention.

The dashed line 21 marks the recording area of the acquisition unit 20. In the example, the acquisition unit 20 is a camera.

The acquisition unit 20 records the depicted image area, i.e. in the example the entire opened cassette, and generates a digital representation, which is provided to the artificial neural network.

In addition to the imaging camera shown, the acquisition unit 20 may comprise an optical sensor, an ultrasonic sensor, a distance sensor, a reflex sensor, a radar sensor, a video camera, or an infrared camera.

The generated image is fed to an artificial neural network to determine the presence and/or position and/or the orientation of the substrate and, based on this, the artificial neural network creates an information data set comprising information about the determined presence and/or position and/or orientation and/or type of the substrate and/or a control command, which is used to directly control the semi-conductor industry machine, or that is used by the machine's control system or is passed on to a higher-level control system.

The information data set can additionally or alternatively be passed on to a user who uses this information to draw conclusions for his actions operating the machine, or who can pass on this information to control systems or other users, or the information data set can be used for later or further evaluation.

The information data set accordingly comprises information to make it possible to determine or derive the presence of the substrate in a slot, or on a tray, or on a robot, or on an end effector, or on a processing station in the machine, or at another location where the mask may be located in the semi-conductor industry machine, and/or the spatial orientation of the substrate with respect to the side of a slot facing a machine robot, or in relation to a tray, or in relation to a processing station, or in relation to another part of the machine, and/or the spatial location of the substrate with respect to a slot, or to a tray, or to a robot, or to an end effector, or to another location where the substrate may be located in the semi-conductor industry machine, and/or the type of substrate, and/or the presence of a pellicle on a substrate, in particular on a mask, and/or the side of a deposited substrate, in particular a mask on which a pellicle is located and/or the orientation of a pellicle in relation to a reference axis of a tray, a cassette, a robot, an end effector, and/or the presence and/or the position and/or the orientation of a substrate.

It therefore makes it possible to detect incorrect positions of the substrate 12, comprising whether the incorrect position concerns a substrate 12 located over several layers of a tray, and/or whether the incorrect position concerns at least two substrates 12 located directly on top of each other, and/or whether the incorrect position concerns a deviation from a specified target position of a substrate 12, and/or whether the incorrect position concerns a substrate 12 not correctly positioned on all provided support points of a tray.

The substrate 12 can, for example, be located in cassettes, as shown in the design example, and/or on trays and/or on an end effector and/or on a chuck and/or on a processing station of the machine and/or on a positioning unit.

The artificial neural network can also record more than one image, in particular at least two images, preferably of the same location, but which are taken by different acquisition units and/or acquisition units arranged differently.

Figure 2:
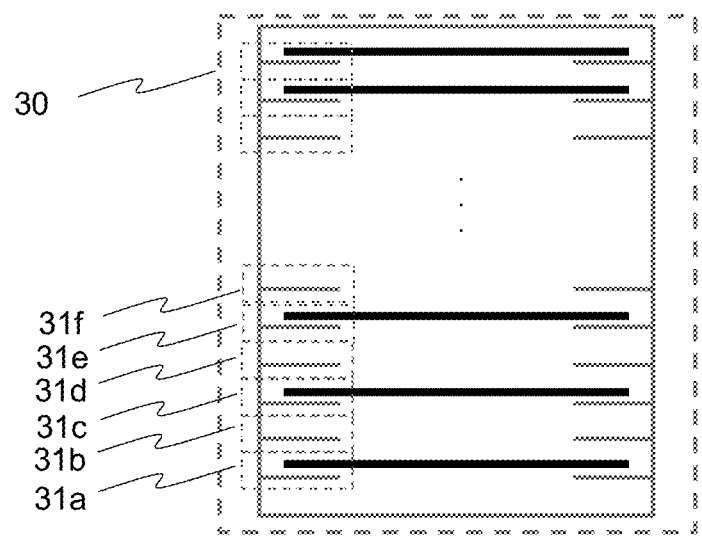

FIG. 2 schematically shows an image or an overall image 30 of the opened cassette from FIG. 1 in a top view.

The image 30 is divided into individual images in the example, each showing a deposit location 11 or a slot. In the example shown, the lowermost six slot images 31a, 31b, 31c, 31d, 31e and 31f are labeled for the sake of clarity.

Figure 3:
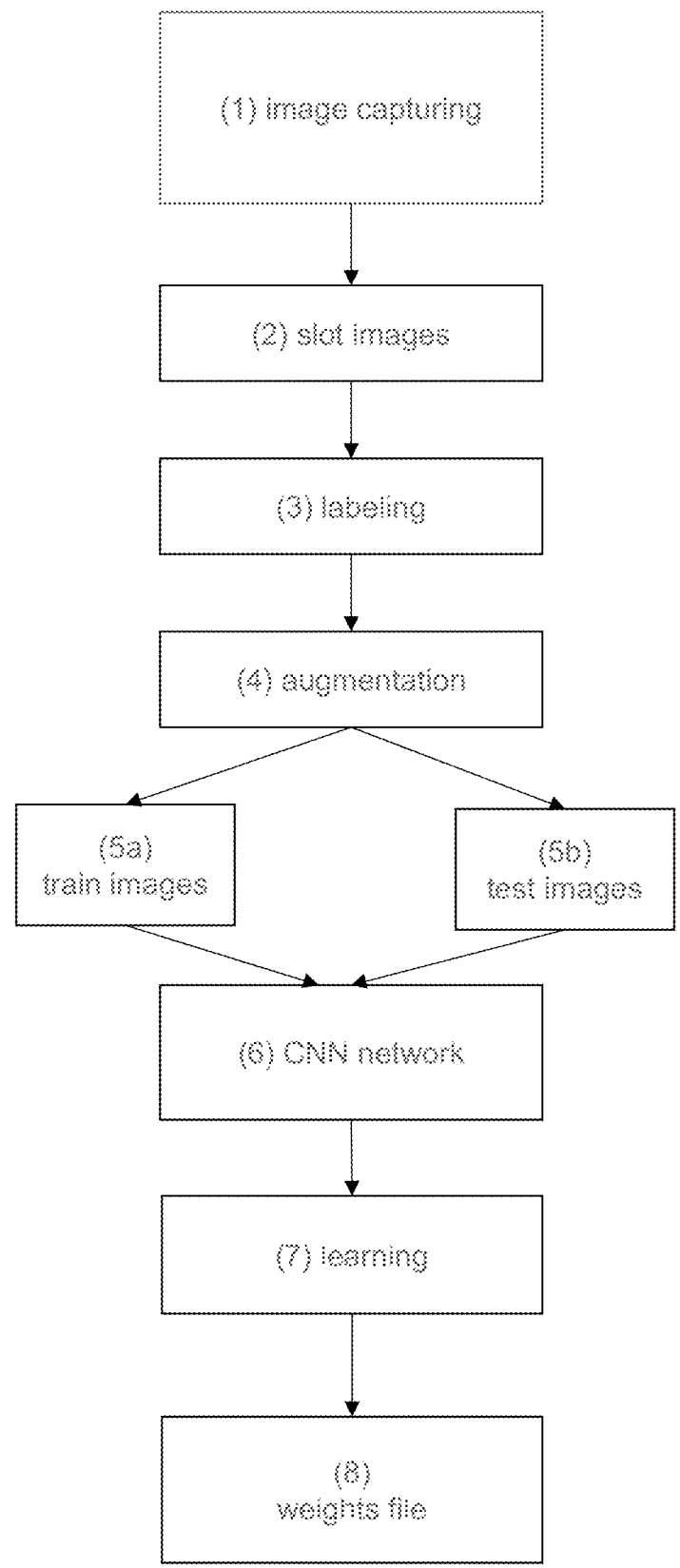

FIG. 3 shows a schematic depiction of the process of training the artificial neural network using a design example of a cassette populated with substrates 12, in the example with wafers. The individual steps are marked (1) to (8) and are shown in the following.

In a first step (1), one or more images are taken of the opened cassette with 25 deposit locations for wafers and with different slot occupancies. For this purpose, images can also be taken from different viewing angles.

In a second step (2), the 25 individual slot images in the example are created from this. This can be done manually through image sections of the overall image 30. However, it is also possible, for example, to create image areas of the overall image 30 via the "bounding boxes," which can then be processed by the artificial neural network. The image sections can be easily varied to different sizes. The ideal size depends on the configuration of the artificial neural network, among other variables.

In a third step (3), labeling occurs, i.e. an allocation to classes: occupied slot or open slot. This classification is done manually. For example, the images can be stored in different folders, which are assigned to the classes. However, it is also possible, for example, to allocate the labels as well as the "bounding boxes" to separate files each assigned to the individual images. If additional classifications, such as the type of substrate, and/or "cross-slotted" wafer, and/or "double slotted" wafer, are to be determined, these classes are also defined here.

In a fourth step (4), the different expressions of the parameters are generated via augmentation of the slot images. In the design example, the images are augmented in the brightness parameter. In other words, the image brightness is varied for training purposes in order to incorporate fluctuations in brightness of the images into the training when applying the artificial neural network. The scaling is also augmented. In other words, the size of the image is varied, similar to zooming in or out, to be able to incorporate fluctuations in the size of the depicted slot and wafers in images into the training when applying the artificial neural network, such as due to small position tolerance-induced spacing differences of the wafers and slots to the acquisition unit.

It is not mandatory to perform these types of augmentation. The number of images for training the artificial neural network in the design example is about 150. However, in the case of several parameters that should be taken into consideration, and/or in the case of several possible expressions, significantly more images may be helpful, which may amount to 10,000 images, for example, depending on the application.

In the 5th step, images are then divided into images for training ("Train") and for testing and validating ("Test" images) the iterations of the training process (FIGS. 5a, 5b). However, this allocation can also be automatically controlled by a program, wherein the artificial neural network uses different images to test and verify the result with other images ("Test" images) in the individual training runs ("Train") images.

In a sixth step (6), the artificial neural network is configured or created. In this example, a "CNN" network is trained, i.e. a "convolutional" neural network, containing convolutional and neuronal layers, among others. In the example, this network has two output neurons that stand for the two defined classes (occupied slot, and open slot). If additional classes are required, for example the "cross slotted" and/or "doubled slotted" wafer classes, and/or wafers with substrate holder, corresponding neurons must be added.

The learning process occurs in the seventh step (7). The network (6) performs the learning process with the set learning parameters (such as the number of iterations, also called "epochs," learning rate and other parameters known for CNN networks.

As a result of the learning process, the so-called "weights file" is finally created in the eighth step (8), containing the parameterization of the individual elements and connections of the CNN network.

Figure 4:
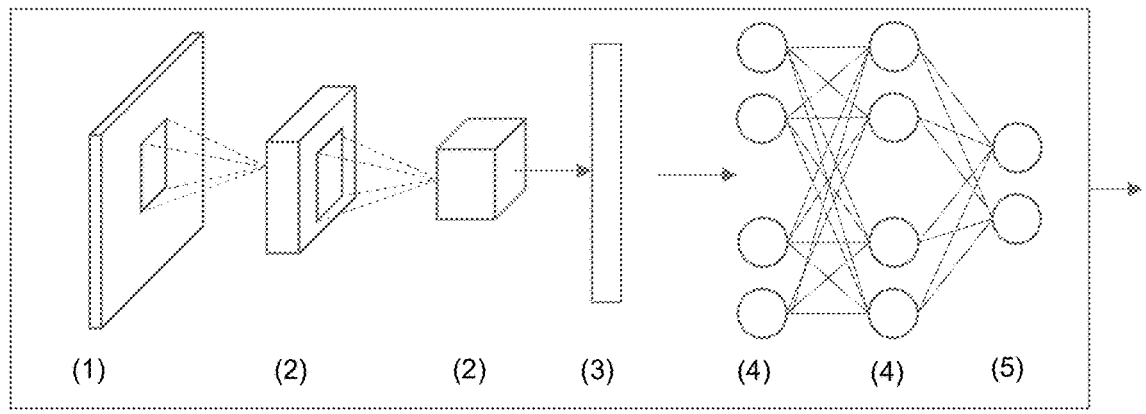

FIG. 4 schematically shows the setup of this "CNN" network or a model of this network using the example of the cassette occupancy in a very simplified representation.

For this purpose, the so-called "Keras" platform is used; however, a variety of other possible platforms can be used, such as "Pytorch" or others.

The designations (1) to (5) specify the different layers or hierarchical levels in FIG. 4.

(1) Input layer: this is where the image is imported into the network.
(2) Convolutional layer(s): A convolutional process with different filters is applied to the image. In the design example, two convolutional layers are used, with the filter size 3×3, number of filters 32 and 64, ReLu activation function, max pooling with size 2×2. However, a variety of other configurations is possible, such as with respect to the number of layers, the number+ size of the filters, or the activation functions.
(3) Flatten layer: Conversion of the three-dimensional result of the last convolutional layer into a one-dimensional format for transfer to the neuronal layer.
(4) Neuronal layer: two neuronal layers with 128 and 64 neurons and ReLu activation function are applied in the example. Dropouts were used to avoid a saturation. However, a variety of other configurations is possible, such as with respect to the number of layers, the number of the neurons, the activation functions or the dropouts. It is also possible to forgo the neuronal layers entirely, which also concerns the classification layer. In this case, the classification can also be generated by a convolutional layer.
(5) Neuronal layer for classification: Two neurons for the classes 'slot occupied' and 'slot open.' In the learning process, the network parameters are optimized through an iterative target-actual comparison of the created classification. These parameters are then used in the application of the classification. A softmax activation was used to generate a float value to represent the image's belonging to the two classes (similar to a 'scoring,' slot open, slot occupied).

FIG. 5a schematically shows the application of the trained artificial neural network to detect a cassette occupancy, and FIG. 5b also schematically shows a section of a data set created by the application with assignments of the individual slot images to the classes "slot_empty" (slot without wafer) and "slot_full" (slot with water) for affiliation based on the design example, wherein the assignment is shown with values between 0 and 1.

The individual steps (1) to (3) are as follows:
(1) An image is taken of the opened cassette.
(2) The individual 25 slot images are created. The corresponding image sections of the individual 25 slots are automatically created from the image of the opened cassette. This is easily possible in the design example shown and also in a practical application if there is a fixed geometric assignment of camera and cassette via pre-defined positions. It may also be convenient here that the acquisition unit is located on the end effector of a robot, which can be moved into the correct position for frontal image acquisition of the cassette.
However, it is also possible to determine the position of the cassette or the slots using object detection methods, for example, which comprise location recognition, and to derive the image sections from this.
(3) As described further above with the steps "Training the network" and "Setup of the network, the CNN network is parameterized with the "weights file" generated when teaching the network. The slot images are individually analyzed one after the other in the artificial neural network, wherein the filtering into convolutional layers and the linking in the neuronal layers generated in the learning process is applied to the individual images, and wherein the assignment of the slot image to the two classes (open slot, occupied slot) is done via the last neuronal layer by the neurons assigned to the classes. This process is also called classification or prediction.

Figure 6:
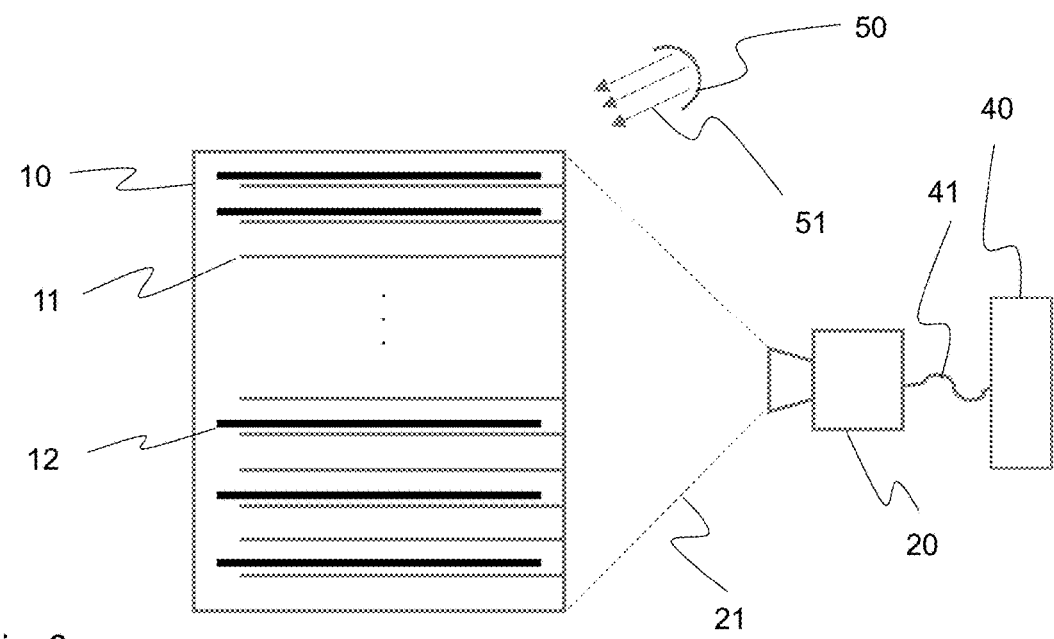

FIG. 6 schematically shows a design example of another setup with an acquisition unit 20, a lighting unit 50 and a computer architecture 40 in a top view.

The acquisition unit 20 can be permanently integrated or mounted in or on the machine, as shown in the design example, or be temporarily integrated or mounted in or on the machine. In the design example, the acquisition unit 20 is permanently arranged in the environment of the machine. The computer architecture 40 can be connected by wire, in this case via cables 41. Of course, wireless connections between the computer architecture 40, acquisition unit 20 and/or lighting unit 50 are also possible.

The acquisition unit 20 can be installed in a fixed location with respect to the machine and/or the location of the image acquisition, as shown in the design example. The acquisition unit 20 or another, second acquisition unit 20 can also be arranged on moving elements of the machine, preferably on a robot arm or on an end effector of a robot or on a positioning unit.

In the design example shown, the images for training and for the application were taken with a camera and transferred to the computer architecture.

However, it is also possible, for example, to use existing stored images from databases for training purposes. It is also possible to directly connect the acquisition unit 20 for capturing images and recording videos for learning purposes and for applying the artificial neural network to the computer architecture, or to use an acquisition unit 20 connected via a network.

For certain application cases, room lighting and therefore the ambient light may already be sufficient. In general, however, it is helpful if a lighting unit 50 is provided as shown in the design example. This is especially useful if images are to be taken within a machine that is generally closed in which there is no ambient light.

The lighting device 50 is provided to emit electromagnetic radiation 51 in the direction of the substrate or the location in or on the machine, preferably at the time an image is being captured. The electromagnetic radiation 51 is preferably located at least in the visible wavelength range and/or in a wavelength range in which the acquisition unit is sensitive. The lighting device 50 may be a lamp, for example a lamp with LEDs or a halogen lamp.

The lighting device 50 can be permanently or temporarily integrated in the machine and/or mounted on the machine, or be installed in a fixed location on the machine, as in this design example. Alternatively or additionally, the lighting device 50 may be located on moving elements of the machine, preferably on a robot arm or on an end effector of a robot or on a positioning unit.

The computer architecture 40 may have different computer configurations, for example a PC, an industrial PC, an embedded controller, such as a Raspberry computer or a programmable logic controller (PLC).

It is understood that these computer configurations should be sized accordingly to be able to provide the required computing power. Ideally, the image analysis by the artificial neural network occurs in real time or at least in near real time. It is also understood that the corresponding communication interfaces should be available.

FIG. 7 shows a schematic design example for a suitable software architecture. It is to be taken into consideration here that a plurality of operating systems, environments and libraries are available, which may be useful for the method as per the invention. The software architecture shown is therefore just one design example among several possible design examples.

In the design example, the software architecture comprises an "OpenCV" library. This is used to import images, to process images or to generate image sections. Alternatively, other libraries or methods can also be used for this task.

Furthermore, the software architecture comprises a "Keras" library. This contains the program packages of the artificial neural network used for the design example, such as for the creation and application of the CNN model, or for the implementation of the learning process. Alternatively, other libraries can also be used, such as "Pytorch," "Caffe" or similar.

Moreover, the software architecture in the design example comprises a "Python" environment for programming. Alternatively, other programming environments or programming languages can be used, such as C++, Java or Mathlab.

The aforementioned components of the software architecture are also referred to as a processing unit comprising the artificial neural network.

Finally, the software architecture in the design example is based on a "Windows" operating system.

Alternatively, other operating systems can also be used, such as Linux, MacOS for Apple computers or Raspbian for Raspberry computers.

Figure 8:
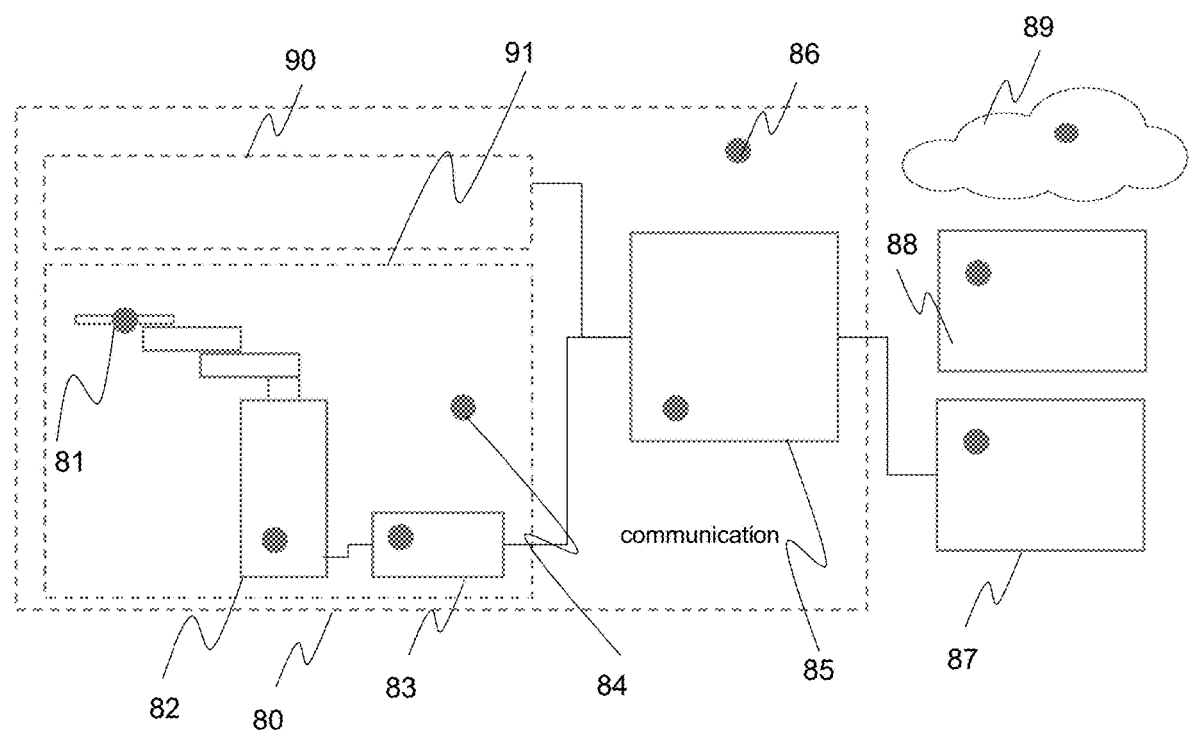

FIG. 8 schematically shows a design example of a computer architecture setup and its integration into a semiconductor industry machine, which is marked in the example with a dashed line 80.

In the sense of the invention, it is therefore possible and also provided to centrally or decentrally implement the computer architecture or the associated components, comprising the processing unit, the computer hardware and the computer's operating system, in a suitable way.

The components of the processing unit, the hardware components, the programs, databases, the operation, data storage, or also other components can either be centrally located on a computer here, or be spread out across several computers or different locations.

This also applies to the individual process steps associated with the artificial neural network, such as the generation of data for the learning process, training or application of the method for processing substrates.

An example is used to illustrate the integration of the artificial neural network for detecting masks and pellicles.

In the example, a camera is provided on an end effector 81. The at least one camera captures images that are used to train the artificial neural network, as well as images that are needed during system operation to detect masks/pellicles.

The images for training purposes are transferred to another, external computer 88, on which the processing unit is installed, and where the CNN model is located in the example. The "weights file" is transferred to a robot controller after training, where a processing unit is also installed and the CNN model is located.

In the application, i.e. during operation of the semiconductor industry machine 80, the camera in the end effector 81 imports the images and transfers them to the robot controller 83, where the artificial neural network then performs the analysis.

As a result, an information data set is generated with information regarding whether a mask is present or not, whether a pellicle is present or not, and possibly the location and orientation of the pellicle. This information is then sent to the system controller 85, where it is used by the machine control system user software running there.

Accordingly, the processing unit may be integrated in the robot 82, in or on the end effector 81 with integrated processing unit, but also in the robot controller 83 with integrated processing unit, in a robot handling system 84 or in the robot system 91 with integrated processing unit, in a system controller 85 with integrated processing unit, in the semi-conductor industry machine 86 with integrated processing unit, in a control system 87 with integrated processing unit not assigned to the machine, such as a factory control system, or another computer 88 with integrated processing unit or in a cloud 89.

Various examples are specified below, which are intended to illustrate the different types of typical incorrect positions of substrates.

Figure 9:
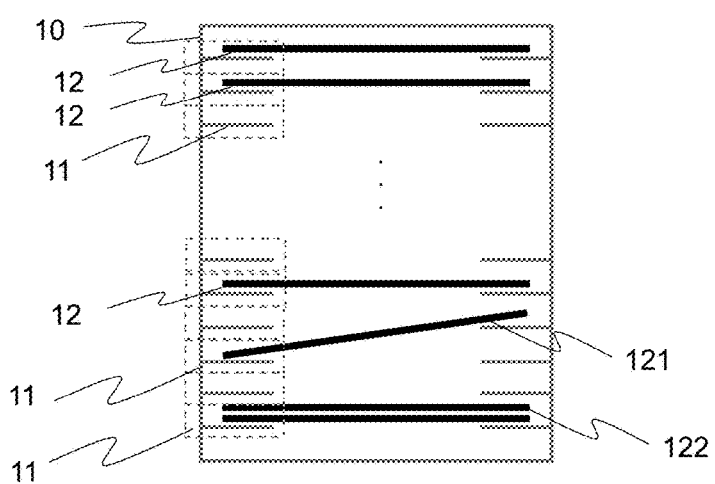

For example, FIG. 9 schematically depicts the design example from FIG. 1 with an opened cassette as storage 10 with a total of three substrates 12 in the correct position each in a separate deposit location 11. The reference signs 121 and 122 each denote a substrate 12 in an incorrect position. In the case of substrate 121, this is a wafer that is positioned in a so-called "cross-slotted" position, i.e. it is located skewed over two deposit locations. In the case of substrate 122, this is two wafers that are positioned in a so-called "double-slotted" position in one deposit location 11. In both cases, these are incorrect positions, which prevent further processing of the substrate and may require the user to intervene manually.

To detect the incorrect positions shown, for example,
slot images with correct wafer placement are taken
slot images with the incorrect "cross-slotted" position are taken
slot images with the incorrect "double-slotted" position are taken The model of the artificial neural network can be defined with the classes "slot without wafer," "slot with correctly placed wafer," "slot with double-slotted wafer" and "slot with cross-slotted wafer." The model can be trained accordingly and the "weights file" can be created. In this way, the artificial neural network can be used to detect the cassette mapping and incorrect positions in machine operation.

Figure 10:
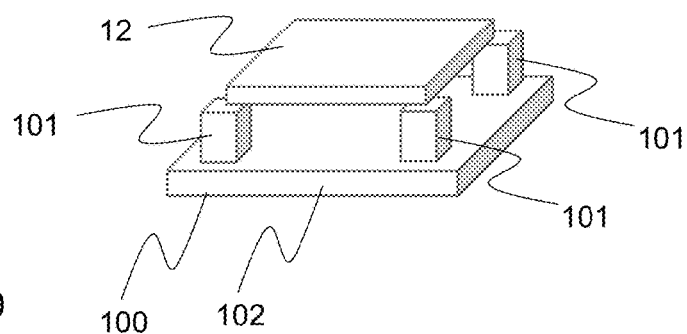

FIG. 10 schematically shows a design example of a tray 100 for substrates 12 with substrate 12 placed in the correct position in an oblique view. The tray 100 comprises a total of four position points 101 placed on the corners, on which the substrate 12, a mask in the example, should be located when positioned correctly.

Figure 11A:
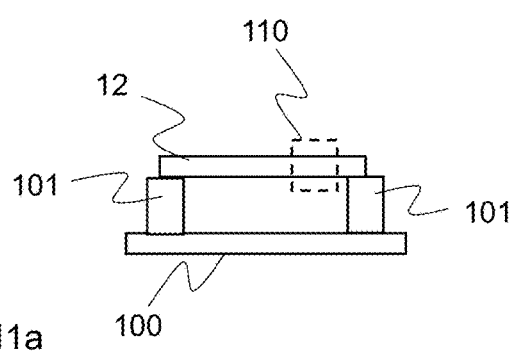
Figure 11B:
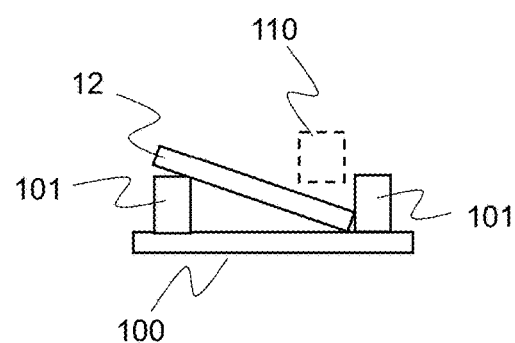

FIGS. 11a and 11b schematically depict a design example of the support for wafers with a wafer placed in the correct position (FIG. 11a) and in an incorrect position (FIG. 11B), which is based on the tray 100 from FIG. 10, in a top view. The example is intended to illustrate the predominant problems in state of the art technology when using rule-based image processing to detect a mask.

As shown in the example, a rule-based method requires a discreet area be defined, which is defined in the example with the dashed border 110. While the placed substrate 12 in FIG. 11a can be detected using the rule-based image recognition system, the incorrect position in FIG. 11b leads to a substrate 12 not being detected, since the substrate 12 is located outside of the defined, discreet area 110.

Figure 12A:
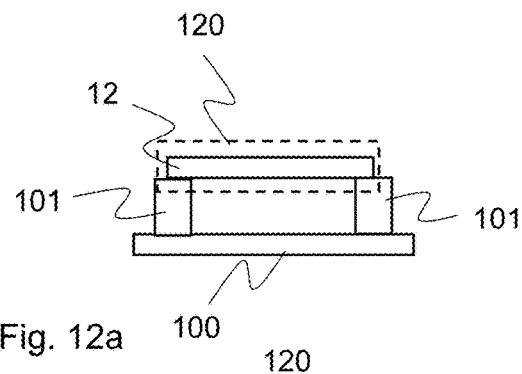
Figure 12B:
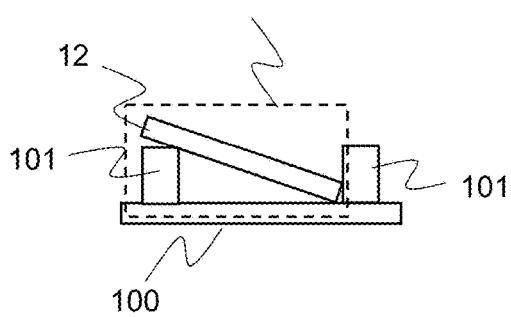

FIGS. 12a and 12b show another schematic design example of a receptacle for wafers with a wafer placed in the correct position (FIG. 12a) and in an incorrect position (FIG. 12b), wherein an artificial neural network is used instead of rule-based image recognition. This may be a CNN network as described further above, or a different network. A schematic image section 120 of the entire mask can be used for teaching and detection during image recognition via artificial neural network as per the invention. This makes it possible to also detect a substrate 12 that significantly deviates from its target position. In this example, the substrate 12 has sufficient characteristics of a typical substrate 12, which permits an allocation, even in the case of a clear incorrect position.

The mask in the example of FIG. 12b is thus detected, even though it is in an incorrect position. Depending on the design of the artificial neural network, the mask can also be classified as being in an incorrect position.

Figures 13A, 13B, 13C:
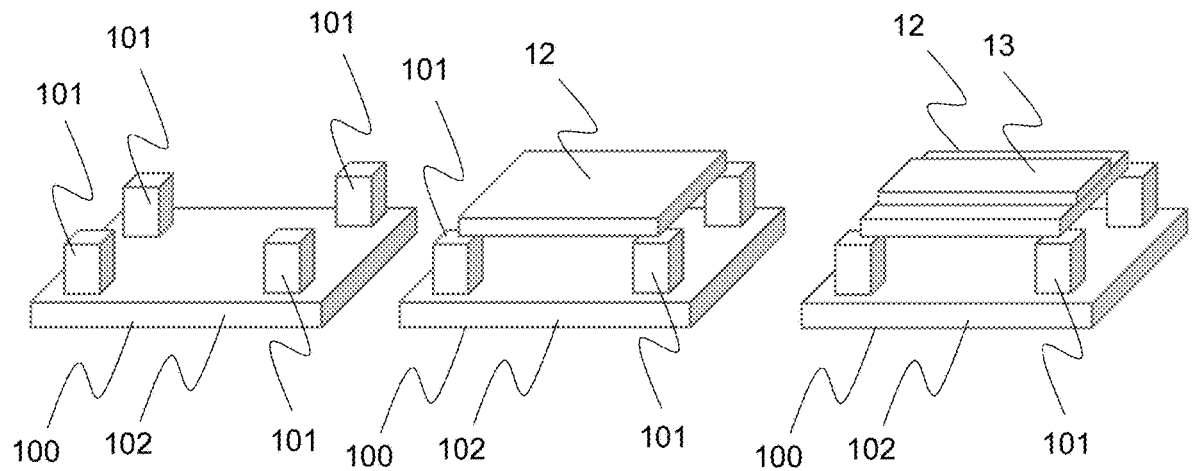

FIGS. 13a, 13b, 13c, 13d, 13e and 13f schematically depict different typical embodiments of a tray 100 for substrates 12 in an oblique view. In this example, the substrate 12 is a mask, which is shown without pellicle (FIG. 13b) or with pellicle 13 (FIGS. 13c to 13f). FIG. 13a shows the tray 100 without substrate 12.

Figures 13D, 13E, 13F:
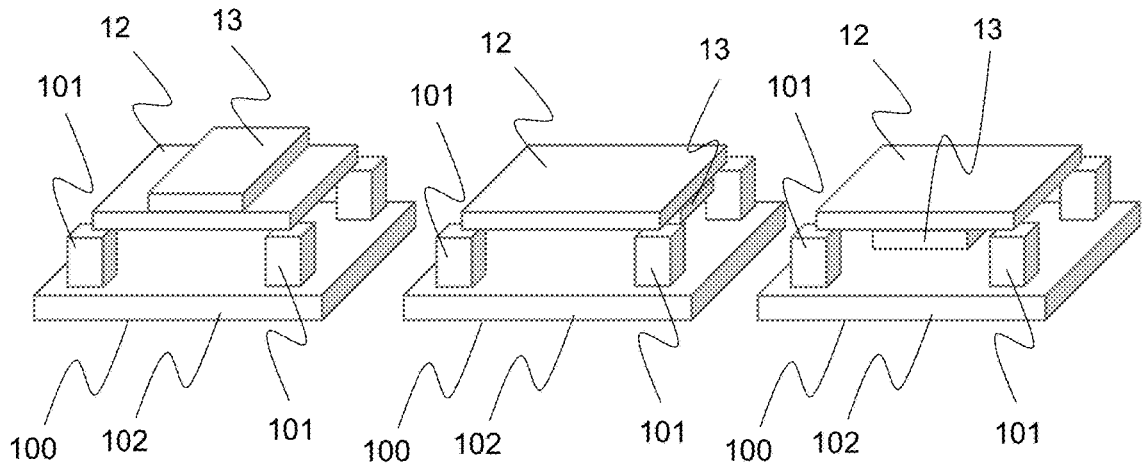
Figures 14D, 14E, 14F:
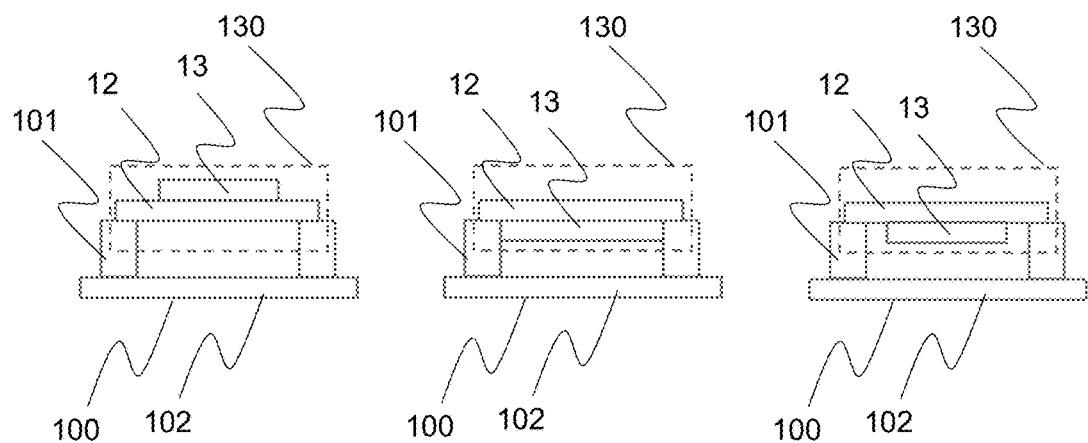

In FIG. 13c, the pellicle 13 is arranged on top of the mask transverse to the front side 102 of the tray 100. In other words, the mask with the pellicle is oriented so that the pellicle is located transversely on the top side. In FIG. 13d, the pellicle 13 is arranged on top longitudinally on the mask.

In FIG. 13e, the pellicle 13 is arranged below the mask transversely to the front side 102 of the tray 100. In FIG. 13f, finally, the pellicle 13 is arranged below the mask longitudinally. The designations "on top" or "below" refer to a deposited substrate, wherein "below" then refers to the bottom. The designations "longitudinally" and "transversely" refer to the front side 102 of the tray 100.

The FIGS. 14a, 14b, 14c, 14d, 14e and 14f correspondingly schematically show the respective image sections 130, which the artificial neural network uses to detect pellicles. It would also be possible and sufficient to use parts of the image sections shown, provided these clearly describe the situation. For example, it would also be sufficient to use the right or left half of the images.

Figures 14A, 14B, 14C:
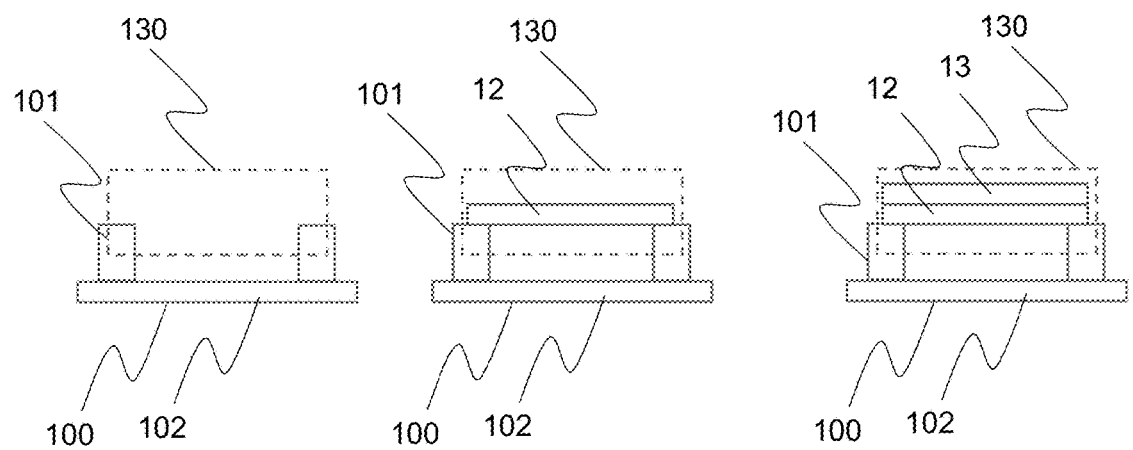

In the example of FIG. 14a, corresponding to the example of FIG. 13a, it is detected that no substrate 12 is present on the tray 100. In the example of FIG. 14b, a substrate without pellicle is detected, corresponding to the example of FIG. 13b.

The examples explained above show based on two simple parameters alone, "substrate present/not present," and "pellicle present/not present," or in which layer there is a detected pellicle, the complexity that a rule-based method would require in which each layer would have to be stored in corresponding rules.

If a system parameter then changes, for example to the effect that the ambient lighting conditions change because the machine is used in a different environment, or material or optical properties of substrates or pellicles change, all of the rules would have to be redefined and restored, which can lead to a tremendous amount of work and expense.

So, for example, it is conceivable that a new end effector is installed on the semi-conductor industry machine, which also has an additional controllable rotational axis, and which makes it possible to grip and transport even slightly skewed substrates 12. If this makes it possible to grip substrates, for example, up to a skewed position of the substrate at an angle of up to 2°, 5° or 7° with respect to the horizontal, to correct the skewed position or to transport them, then these types of new rules can be very easily defined and stored.

The use of an artificial neural network in the sense of the invention makes it possible, on the other hand, to use some images showing the corresponding skewed positions of the substrate 12, and/or changing system parameters, to re-train or additionally train the artificial neural network and thus to significantly and quickly increase the semi-conductor industry machine's efficiency.

Figures 15A, 15B:
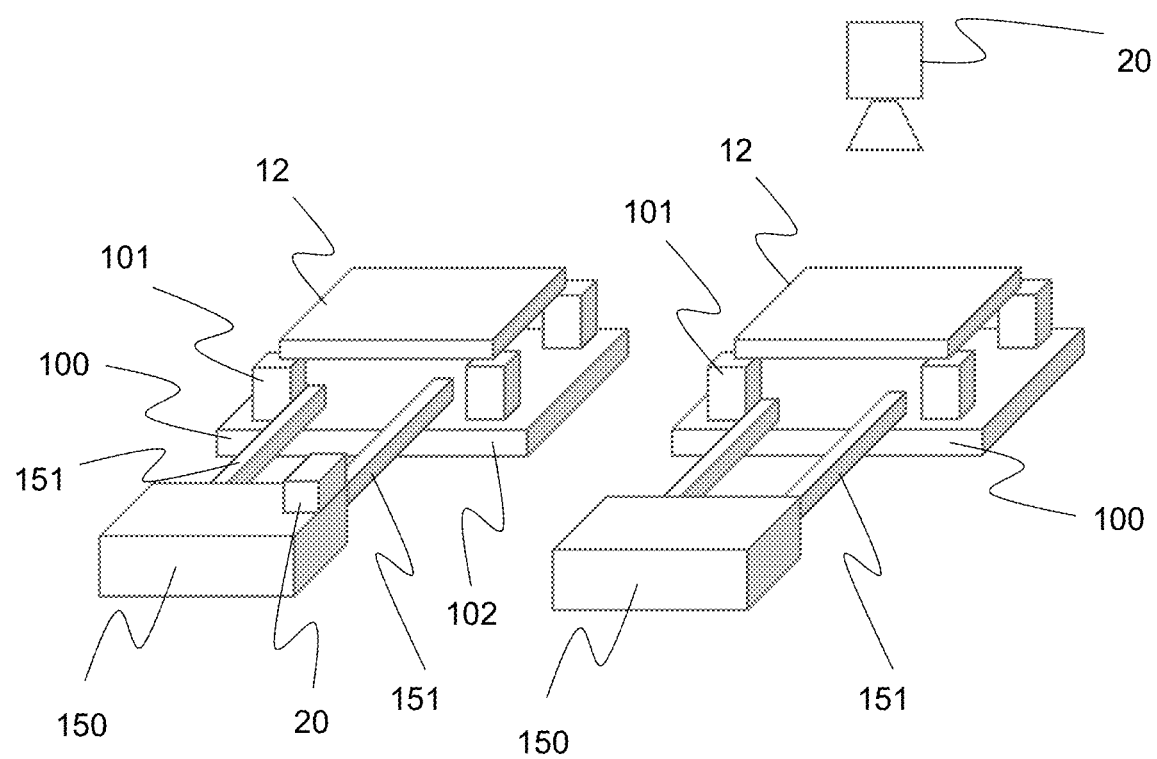

FIGS. 15a and 15b schematically depict another design example with a different arrangement of the acquisition unit 20 in an oblique view.

In the design example of FIG. 15a, the acquisition unit 20, an imaging camera in the example, is arranged on an end effector 150. The advantage in this arrangement is that at least one gripper arm 151 is located in the acquisition unit's 20 field of view.

In the design example of FIG. 15b, the acquisition unit 20, also an imaging camera in the example, is mounted in a non-changing position on the semi-conductor industry machine.

The advantage of the acquisition unit 20 arranged in this way is that at least the relevant objects, in particular the tray 100, or the robot or a certain area of interest is in the acquisition unit's 20 field of view.

The robot and the robot arm are not shown in the design examples for the sake of clarity. Several acquisition units 20 can also be attached in different alignments, whose images are then combined and evaluated, or whose images are evaluated individually and then the results of the evaluation are compared with each other.

Figure 16:
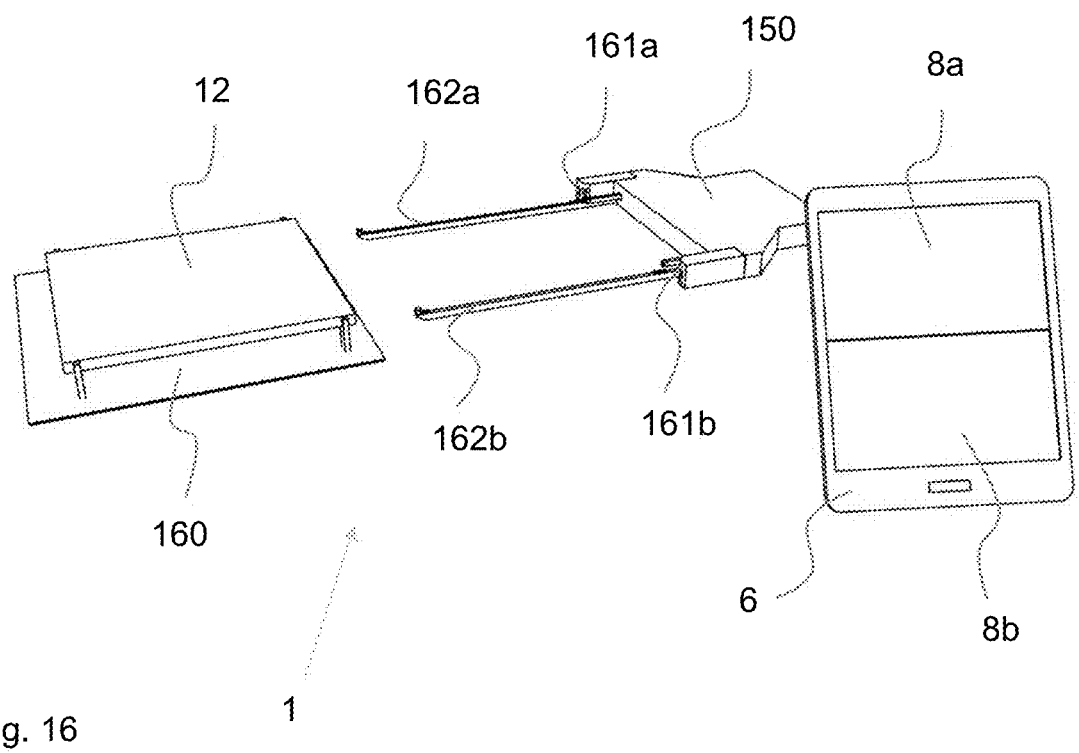

FIG. 16 shows a schematic view of a system 1 for processing semiconductor elements.

The system 1 comprises an end effector 150 with the arms 162a, 162b via which a substrate 12, in the example a mask or a wafer, can be deposited on and/or picked up from a deposit 160.

The end effector 150 is part of a robot (not shown) and is moved in several spatial directions by the robot. In particular, a robot with a radial and theta axis can be used.

According to the invention, the system comprises at least one acquisition unit, which is arranged on the end effector 150 so it can move with it in this design example.

In this design example, two cameras 161a, 161b are provided as the acquisition unit. The optical axes of the two acquisition units can be aligned at an angle to each other or also parallel to each other. In the design example, the two optical axes of both acquisition units are aligned parallel to each other, but laterally offset from one another to be able to show image arms 161a and 161b.

The cameras 161a and 161b are located on the front of the end effector 150 in this design example between or next to the arms 162a and 162b.

The image of the cameras 161a and 162b is transmitted to an electronic device, in this design example to a portable tablet 6.

In this design example, the views of the cameras 161a, 162b on the tablet are shown separately as view 8a and view 8b. This can be realized, for example, via a split screen.

For example, it is possible that the camera 161a is aimed at the arm 162a, whereas the camera 161b is aimed at the front edge of the substrate 12.

In this way, the motion sequence of the end effector 150 can be monitored via the camera 161a.

Camera 161b can be used to easily determine if there is an offset when picking up or depositing the substrate 12, or whether the substrate 12 is in a position, such as a skewed position of 5°, which still allows for processing.

In addition, the cameras 161a and 161b can be used to check whether a substrate 12 is on the end effector 150.

Additional sensors can then be done without.

Figure 17:
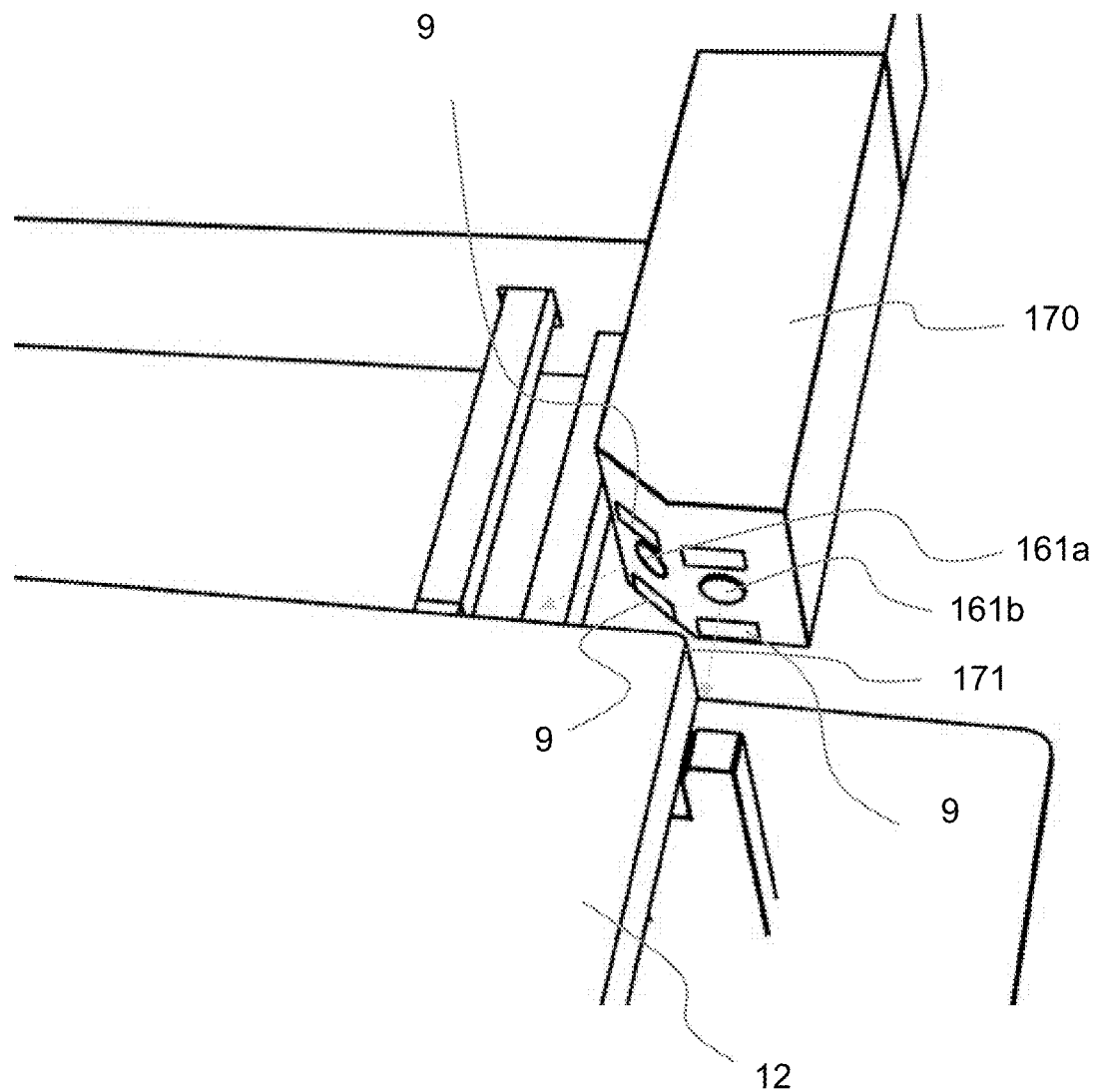

FIG. 17 shows a design example in which a single camera housing 160 contains two cameras 161a and 161b in a corner.

It can be seen that each of the cameras 161a and 161b capture the edge emanating from the corner 171. The two cameras 161a and 161b are advantageously arranged so that their viewing directions or their optical axes are not parallel to each other, but rather remain at an angle to each other.

The angle of the optical axes can be formed in a plane, which is specified by the arms 162a and 162b, i.e. the gripping device of the end effector. In the design example, the optical axis of the at least one acquisition unit is located in this plane in order to at least capture the one arm 162a, 162b well. However, it is also possible that the optical axis of the second acquisition unit is not located in this plane. For example, it can be detected earlier when approaching an object whether there is a pending collision.

This angle can be designed differently and is advantageously between 5° and 90°, but preferably between 10° and 80° and particularly preferably between 15° and 75°. In the example, the angle is between approximately 20° to 30°. This design allows for a particularly compact configuration of the camera housing 170 and therefore a simple and space-saving assembly on the end effector.

An offset can also easily be detected when picking up or depositing. The camera housing 170 is preferably mounted on the end effector.

In this way, a compact and easy-to-integrate possibility can be created to arrange the acquisition units on the end effector so that they can be moved with the end effector and at the same time provide the necessary information during operation or when moving the end effector.

The camera housing 170 can also comprise lighting 9 (e.g. LEDs) for the camera's 161a, 161b field of view. The lighting 9 is preferably arranged here so that the main direction of the light's beam is parallel to the viewing direction of the camera 161a, 161b.

Figure 18:
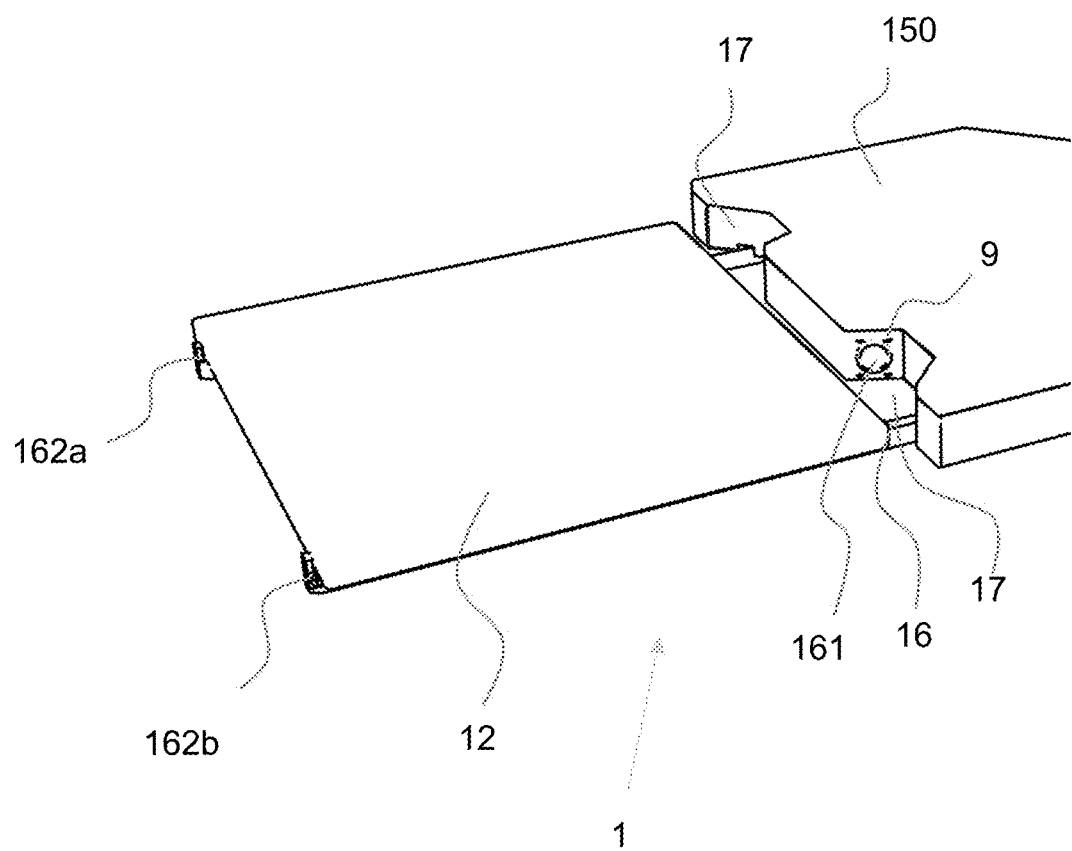

FIG. 18 shows a design example in which a camera 161 with integrated lighting 9 is integrated in the end effector 150.

For this purpose, the support of the end effector 150, from which the arms 162a, 162b protrude, has a recess 17 within which the camera 161 is arranged. The camera 161 in this embodiment of the invention is installed at an angle in the housing of the end effector 150.

In this way, the camera 150, which can have a rod-shaped housing (not shown), takes up an otherwise largely unused space in the housing of the end effector 150. Moreover, the angled arrangement can provide a large field of view. The optical axis of the camera 161 can in particular have an angle from 30 to 60° to the main extension direction of the arms 162a, 162b.

The at least one camera 161 is located in the recess 17 in an angled surface, so that the camera is aimed at the corner 16 of the substrate 12.

It is understood that a camera is or can be preferably present in the second recess 17, which is obscured in this view.

Figure 19:
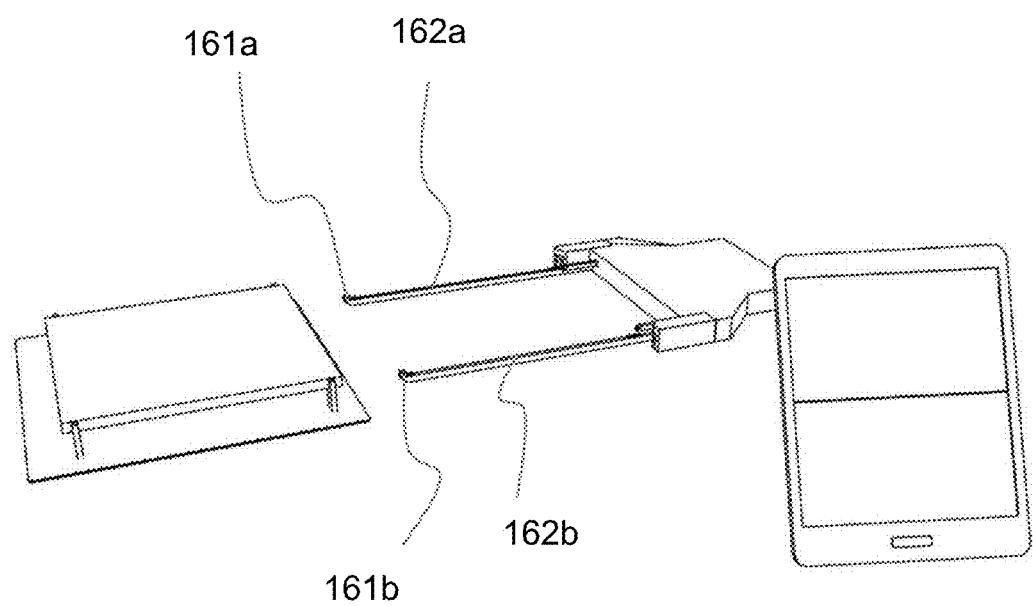

FIG. 19 shows another embodiment of the invention, in which the cameras 161a, 161b are arranged on the arms 162a, 162b of the end effector 150.

Figure 20:
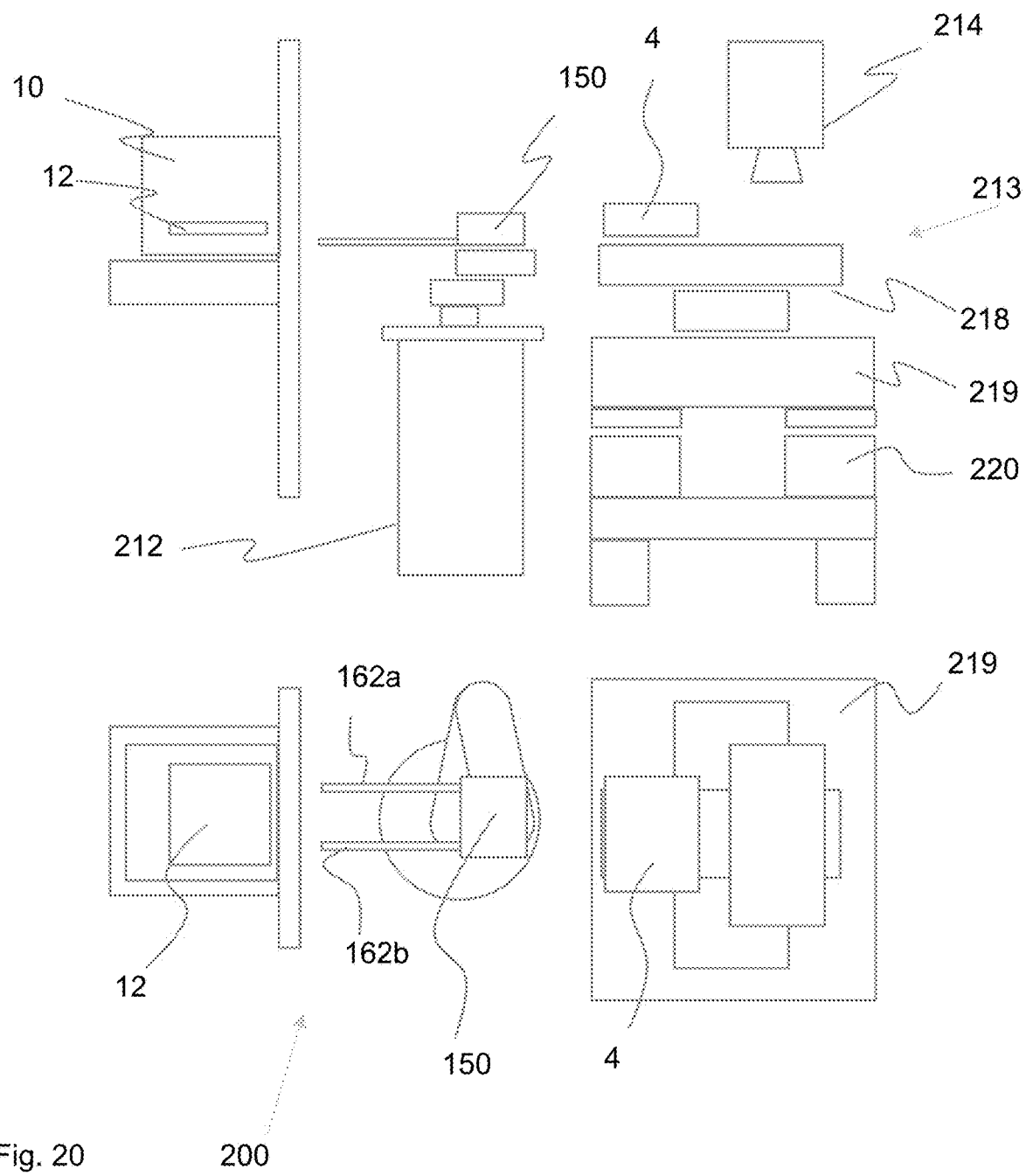

FIG. 20 shows a side view and a top view from above (shown below) of the key components of a semi-conductor industry machine 200 for processing semiconductor elements.

The machine 200 comprises a storage 10, in the example a cassette, for substrates 12, in the case depicted for masks, which is shown in this case in particular as FOUP ("front opening unified pod"), which is opened or closed with a SMIF ("standard mechanical interface") load port.

A robot 212 with the end effector 150 can be used to remove substrates 12 from the storage 10 and transport them further to the processing station 213.

The processing station 213 comprises a movable stage 218 in this design example, on which there is a chuck for holding the mask.

The mask processing machine shown here may in particular comprise an inspection device 214, which is located on a plate 219 that is supported by the insulators 220 to be insulated from vibration.

At least the end effector 150 of the robot 212 comprises a camera that the robot 212 can use to capture images in operation that can be processed by the artificial neural network.

Figure 21:
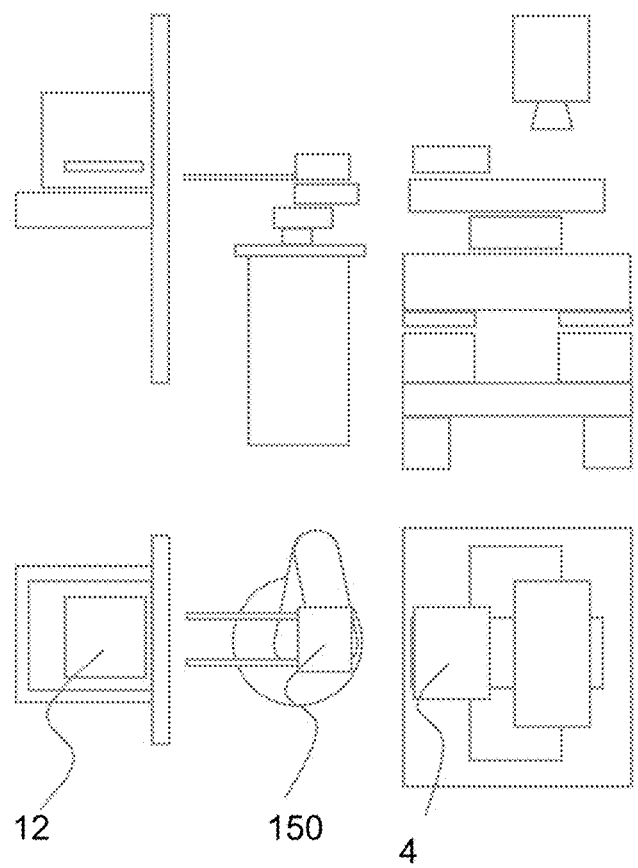

At the same time, the occupancy of the storage 10 with substrates can be checked here. The robot 212 only approaches receptacles in which there is a FIG. 21 shows the system shown in FIG. 20 at rest. As shown in FIG. 20, the end effector with its arms 162a, 162b is moved to below the mask to pick up the substrate 12 or the mask from the storage 10 or the cassette.

Figure 22:
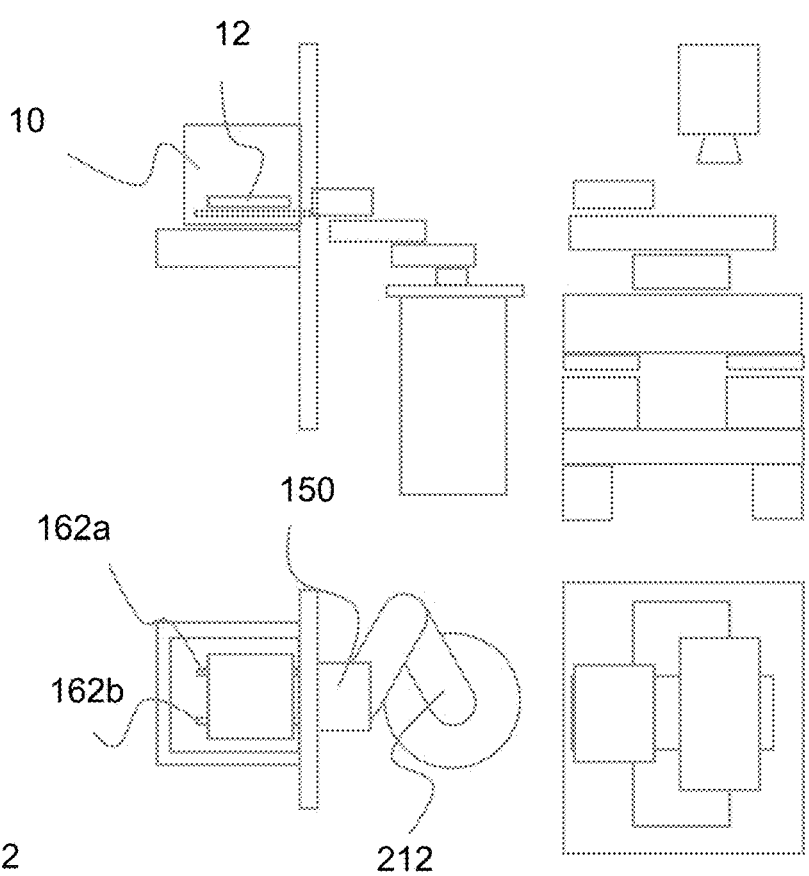
Figure 23:
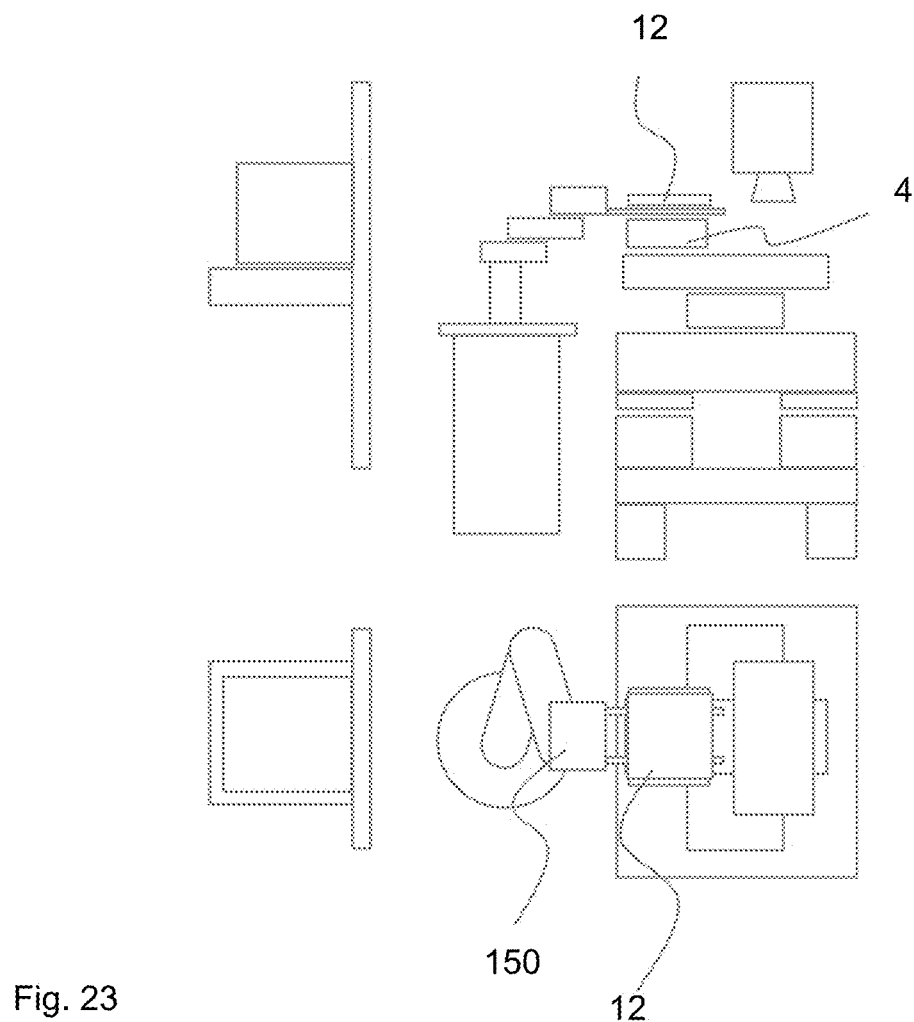

The mask is lifted with the robot 212 (FIG. 22) and moved into the target position on the deposit 4 shown in FIG. 23. The target position is monitored by the camera mounted on the end effector.

The semi-conductor industry machine may also contain a vacuum chamber. It is understood that the methods as per the invention can also be executed within vacuum chambers, provided the components, such as the acquisition unit or the lighting, if necessary, and/or if they are located within a vacuum chamber, are designed to be suitable for vacuums.

For example, the acquisition unit 20 can be installed without tools by using clips.

The image recognition by the artificial neural network can be used to very precisely and efficiently control the semi-conductor industry machine or an end effector of a robot.

The method as per the invention thus makes it possible to process substrates, in particular wafers, masks or flat panel displays.

As a supplement, an end effector can be used where the substrate, i.e. the masks, the wafer or the flat panel display, is positioned on the receptacle by motors integrated in the end effector, for example using a piezo. This means it is possible to more precisely position the substrate than via the remote drive in the robot. In another embodiment of the invention, the end effector itself comprises actuators for finely adjusting the target position.

In particular, the advantages of using the artificial neural network come to bear here, which make it possible to detect tolerable and easy-to-adjust deviations from target positions of the substrate, i.e. deviations from an ideally deposited substrate, and to decide whether and under which adjustments to the end effector processing is possible.

The robot itself can also, as is provided in one embodiment of the invention, also have its motion sequence finely adjusted via image recognition.

Figures 24A, 24B:
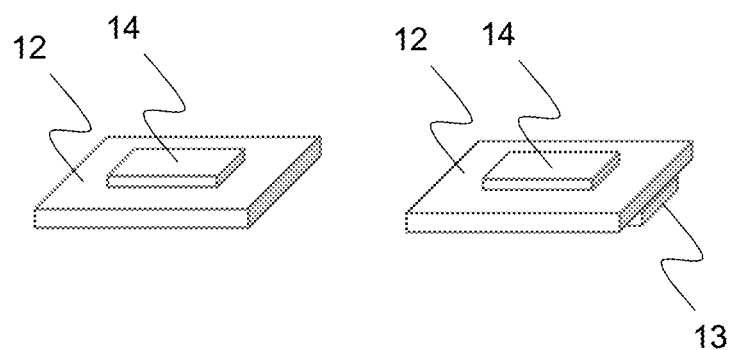
Figure 25A:
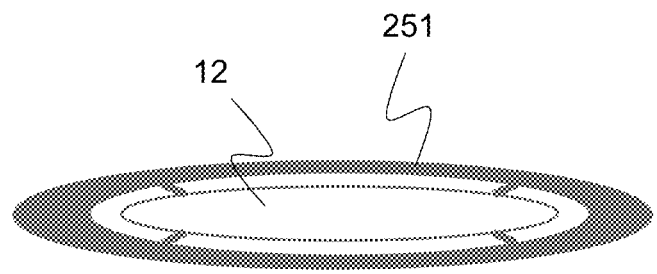
Figure 25B:
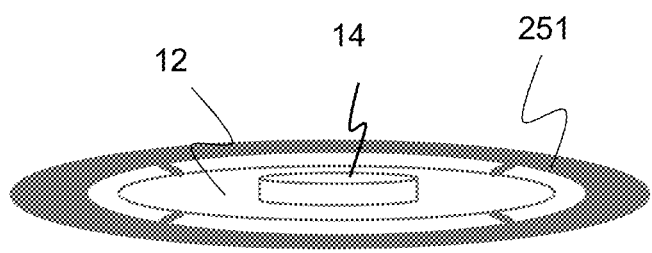

FIGS. 24a, 24b each show a design example of a substrate with a structure using the example of a mask, and FIGS. 25a, 25b each show a design example of a substrate with a substrate holder using the example of a wafer, in an oblique view. These design examples should depict possible superstructures 14 of a substrate 12, which, according to the invention, can be recognized by classifying the type of substrate 12.

FIG. 24a schematically shows a substrate 12, in the example a mask, with a structure 14; FIG. 24b shows the mask from FIG. 24a with a structure 14 and a pellicle 13 transversely below.

FIG. 25a schematically shows a substrate 12, in the example a wafer, with a substrate holder 251 for holding the substrate 12 or wafer; FIG. 25b shows the wafer from FIG. 25a with a structure 14. A structure 14 may, for example, comprise a calibration device for the machine, measuring equipment or other components.

Figure 26:
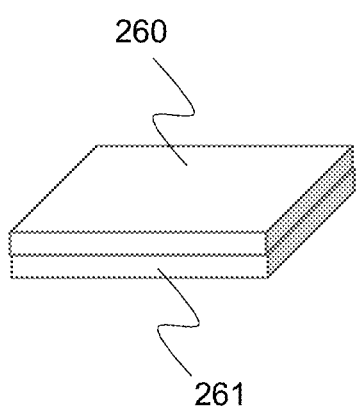

Finally, FIG. 26 shows a substrate holder with an upper shell 260 and a lower shell 261.

The method as per the invention therefore allows, according to one embodiment, for the artificial neural network also detecting substrate types, or for the generated information data set to be used to derive the substrate types, comprising
  whether the substrate 12 has a substrate holder 251, and/or
  whether the substrate 12 has a structure 14, and/or
  whether the substrate 12 has a pellicle 13, and/or
  whether the substrate 12 is a wafer, and/or
  whether the substrate 12 is a mask, and/or
  whether the substrate 12 is a flat panel display.

The presence and/or position and/or orientation and/or position of the substrate 12 and/or of the substrate type can also be derived from the generated information data set.

Furthermore, the artificial neural network can be configured and taught to detect substrate types and to issue the required information data set to detect or derive the substrate types.

LIST OF REFERENCE SIGNS

1 Handling system
4 Deposit
6 Tablet
8a, 8b View
9 Lighting
10 Storage
11 Deposit location
12 Substrate
13 Pellicle
14 Structure
16 Corner
17 Recess
20 Acquisition unit
21 Image area
30 Overall image
31-31f Slot images
40 Computer architecture
41 Cable
50 Lighting unit
80 Handling system
81 End effector
82 Robot
83 Robot controller
84 Robot handling system
85 System controller
86 Semi-conductor industry machine
87 Control system
88 Computer
89 Cloud 91 Robot system
100 Tray
101 Position points
102 Front side of the tray
110 Discreet area of the image recognition
120 Image section
121 Substrate in incorrect position ("cross-slotted")
122 Substrate in incorrect position ("double-slotted")
130 Image section
150 End effector
151 Gripper arm
160 Deposit
161a, 161b Camera
162a, 162b Gripper arm of the end effector
170 Camera housing
200 Machine
212 Robot
213 Processing station
214 Inspection device
218 Stage
219 Plate
220 Insulator
251 Substrate holder
260, 261 Shell

The invention claimed is:

1. A method for processing substrates including wafers, masks, and flat panel displays, with a semiconductor industry machine, the processing including a gripper or an end effector configured to pick up and transport of the substrates between two or more processing stations, the method comprising:
   obtaining, with at least one acquisition unit comprising an image recording device, at least one image of a location in the semiconductor industry machine;
   generating, with a processing unit executing an artificial neural network, an information data set comprising information as to whether a substrate is present in the location in the semiconductor industry machine, the information data set being generated by analyzing the at least one image with an the artificial neural network executed by the processing unit, wherein the information data set comprises information on a presence of the substrate including: in a slot; on a tray; on a robot; on an end effector; or on a processing station in the machine; and
   generating, with the processing unit executing the artificial neural network, a control command by evaluating the information data set, the control command comprising an instruction to move a system unit of the semiconductor industry machine,
   wherein the artificial neural network executed by the processing unit detects incorrect positions of the substrate, including an incorrect position selected from the group consisting of: whether the substrate is located over several layers of a tray, whether the incorrect position concerns at least two substrates located directly on top of each other, whether the incorrect position concerns a deviation from a specified target position of a substrate, and whether the incorrect position concerns a substrate not correctly positioned on all provided support points of a tray, and
   wherein the instruction to move the system unit is selected from the group consisting of a robot, a movable element of a robot, a robot arm, an end effector of a robot arm, and a positioning unit; and
   transporting, based on the instruction, the substrate to a designated location.

2. The method according to claim 1, wherein the artificial neural network forms at least one model that comprises at least one convolutional layer and at least one neuronal layer, wherein the artificial neural network uses at least one regression, machine learning and deep learning.

3. The method according to claim 1, wherein the artificial neural network is configured and taught to detect substrate types and outputs the information data set required to detect or derive the substrate types.

4. The method according to claim 1, further comprising wherein the substrate is located: in a cassette or on a positioning unit.

5. The method according to claim 1, wherein the at least one image is generated by at least one acquisition unit integrated in the machine, or arranged on the machine or in the environment of the machine, or wherein the at least one acquisition unit is installed in a fixed location in relation to the machine, or is located on moving machine elements including: on a robot arm, on an end effector of a robot, or on a positioning unit.

6. The method according to claim 1, wherein the acquisition unit comprises an optical sensor, an ultrasonic sensor, a distance sensor, a reflex sensor, a radar sensor, an imaging camera or video camera, or an infrared camera.

7. The method according to claim 1, wherein two acquisition units including two cameras, are provided, which are located at the front of an end effector, wherein the optical axes of the two acquisition units are parallel or at an angle to each other, wherein the angle is: between 5° and 90°, between 10° and 80°, or between 15° and 75°.

8. The method according to claim 1, wherein the artificial neural network acquires at least two images of the same location, which were generated by different acquisition units and/or acquisition units that are arranged differently.

9. The method according to claim 1, wherein a lighting device is provided, which is designed to emit electromagnetic radiation in the direction of the substrate or the location in or on the machine, wherein the electromagnetic radiation is in a wavelength range in which the acquisition unit is sensitive.

10. The method according to claim 1, wherein the artificial neural network is trained on a different computer architecture than the application of the artificial neural network.

11. The method according to claim 1, further comprising: providing the processing unit comprising at least one artificial neural network for image processing and training the artificial neural network by capturing and/or providing: at least two images, at least 20 images, at least 100 images, or at least 1,000 images, which in their expression differ at least in one parameter or influencing factor.

12. The method according to claim 11, wherein at least one of the following training parameters includes:
   a type of the substrate;
   a position of the substrate in relation to a target position;
   an orientation of the substrate in relation to a reference in the machine;
   a number of substrates in a slot or in a cassette in total;
   a color or the transmission behavior of the substrate;
   dimensions of the substrate;
   a presence of identification tags;
   a presence of a pellicle as well as the location, position and orientation of the pellicle in relation to the substrate;
   a type, color or condition of the background; and
   light scattering from the environment,
   wherein the artificial neural network is trained based on a categorization or classification of the images.

13. The method according to claim 11, further comprising:
  capturing and storing images during the application of the artificial neural network in the semiconductor industry machine; and
  using the images in at least one initial or at least one new learning process.

* * * * *